US010768262B2

(12) United States Patent
Danesh et al.

(10) Patent No.: US 10,768,262 B2
(45) Date of Patent: Sep. 8, 2020

(54) MANAGING THE DETERMINATION OF A TRANSFER FUNCTION OF A MEASUREMENT SENSOR

(71) Applicant: Analog Devices Global Unlimited Company, Hamilton (BM)

(72) Inventors: Seyed Amir Ali Danesh, Edinburgh (GB); John Stuart, Norwood, MA (US)

(73) Assignee: Analog Devices Global Unlimited Campany, Hamilton (BM)

( * ) Notice: Subject to any disclaimer, the term of this patent is extended or adjusted under 35 U.S.C. 154(b) by 55 days.

(21) Appl. No.: 15/691,414

(22) Filed: Aug. 30, 2017

(65) Prior Publication Data

US 2019/0064306 A1 Feb. 28, 2019

(51) Int. Cl.
| | | |
|---|---|---|
| G01R 35/00 | (2006.01) |
| G01R 27/28 | (2006.01) |
| G01R 21/133 | (2006.01) |
| G01R 11/25 | (2006.01) |
| G01R 11/56 | (2006.01) |
| G01R 35/04 | (2006.01) |
| G01R 15/04 | (2006.01) |
| G01R 21/00 | (2006.01) |

(52) U.S. Cl.
CPC .............. *G01R 35/00* (2013.01); *G01R 11/25* (2013.01); *G01R 11/56* (2013.01); *G01R 15/04* (2013.01); *G01R 21/007* (2013.01); *G01R 21/133* (2013.01); *G01R 21/1333* (2013.01); *G01R 27/28* (2013.01); *G01R 35/04* (2013.01)

(58) Field of Classification Search
CPC .... G01R 35/00; G01R 27/28; G01R 21/1333; G01R 21/00
See application file for complete search history.

(56) References Cited

U.S. PATENT DOCUMENTS

| 2005/0275395 A1 | 12/2005 | Yoshihara et al. |
| 2007/0002806 A1 | 1/2007 | Soomro |
| 2008/0040055 A1 | 2/2008 | Dorsey et al. |

(Continued)

FOREIGN PATENT DOCUMENTS

| WO | WO-2013038176 A2 | 3/2013 |
| WO | WO-2014072733 A2 | 5/2014 |
| WO | WO-2017218042 A1 | 12/2017 |

OTHER PUBLICATIONS

"U.S. Appl. No. 15/185,603, filed Jun. 17, 2016", 7 pgs.
"International Application Serial No. PCT/US2016/068089, International Search Report dated Apr. 3, 2017", 5 pgs.
"International Application Serial No. PCT/US2016/068089, Written Opinion dated Apr. 3, 2017", 9 pgs.

(Continued)

*Primary Examiner* — Toan M Le
(74) *Attorney, Agent, or Firm* — Schwegman Lundberg & Woessner, P.A.

(57) ABSTRACT

The present disclosure relates to the control of an operation of a monitor module of an electrical measurement system, where the monitor module has a plurality of operating states, including a) monitor at least a first measurement sensor of the utility meter to determine a first monitor result comprising an estimate of a transfer function of the first measurement sensor and a corresponding certainty value indicative of the accuracy of the estimate of the transfer function of the first measurement sensor, wherein the first measurement sensor is for measuring a first electrical property, and b) do not monitor any measurement sensor of the electrical measurement system.

27 Claims, 18 Drawing Sheets

(56) References Cited

U.S. PATENT DOCUMENTS

| | | |
|---|---|---|
| 2010/0237851 A1 | 9/2010 | Coster et al. |
| 2011/0119041 A1 | 5/2011 | Daudet et al. |
| 2011/0288793 A1 | 11/2011 | Sanchez-loureda et al. |
| 2013/0117582 A1 | 5/2013 | Satyamoorthy et al. |
| 2013/0117589 A1 | 5/2013 | Satyamoorthy et al. |
| 2014/0100808 A1 | 4/2014 | Komati et al. |
| 2015/0164391 A1 | 6/2015 | Hernandez-rosas et al. |
| 2015/0212123 A1 | 7/2015 | Tyrrell et al. |
| 2016/0097699 A1 | 4/2016 | Leao |
| 2016/0154029 A1* | 6/2016 | Danesh ............ G01R 19/0084 324/76.11 |
| 2016/0370814 A1 | 12/2016 | Hanley et al. |
| 2017/0082995 A1 | 3/2017 | Haghighat-kashani et al. |
| 2018/0062390 A1 | 3/2018 | Parashar et al. |
| 2019/0011283 A1 | 1/2019 | Soutar et al. |
| 2019/0064222 A1 | 2/2019 | Danesh et al. |
| 2019/0064307 A1 | 2/2019 | Danesh et al. |

OTHER PUBLICATIONS

"European Application Serial No. 18191080.3, Extended European Search Report dated Jan. 23, 2019", 12 pgs.

"European Application Serial No. 18191081.1, Extended European Search Report dated Jan. 24, 2019", 13 pgs.

"European Application Serial No. 18191083.7, Extended European Search Report dated Jan. 25, 2019", 13 pgs.

"International Application Serial No. PCT/EP2018/073092, International Search Report dated Dec. 13, 2018", 6 pgs.

"International Application Serial No. PCT/US2018/073092, Written Opinion dated Dec. 13, 2018", 12 pgs.

"U.S. Appl. No. 15/691,438, Non Final Office Action dated Jan. 9, 2020", 24 pgs.

"U.S. Appl. No. 15/691,379, Non Final Office Action dated Apr. 6, 2020", 22 pgs.

"U.S. Appl. No. 15/691,438, Response filed Apr. 9, 2020 to Non Final Office Action dated Jan. 9, 2020", 13 pgs.

* cited by examiner

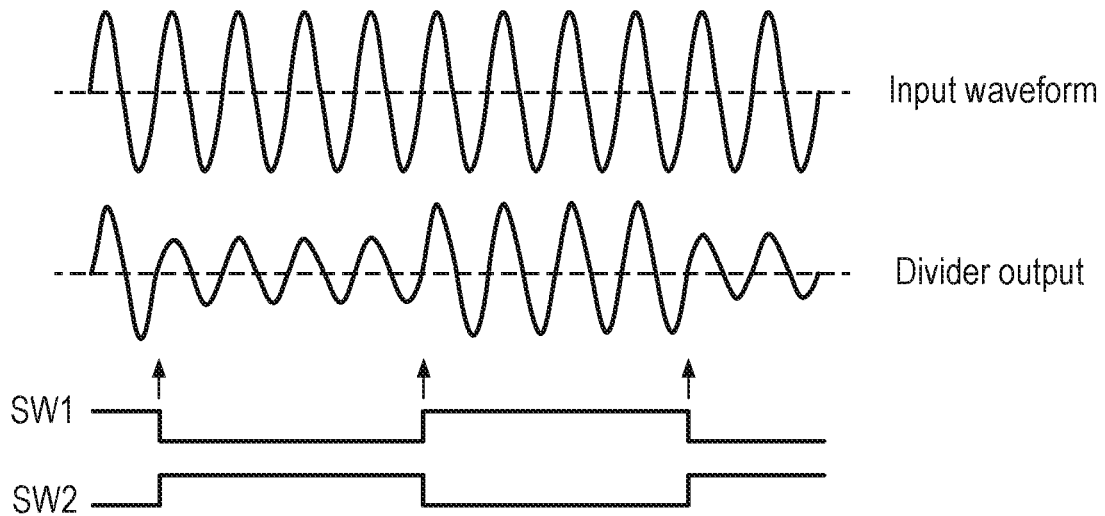
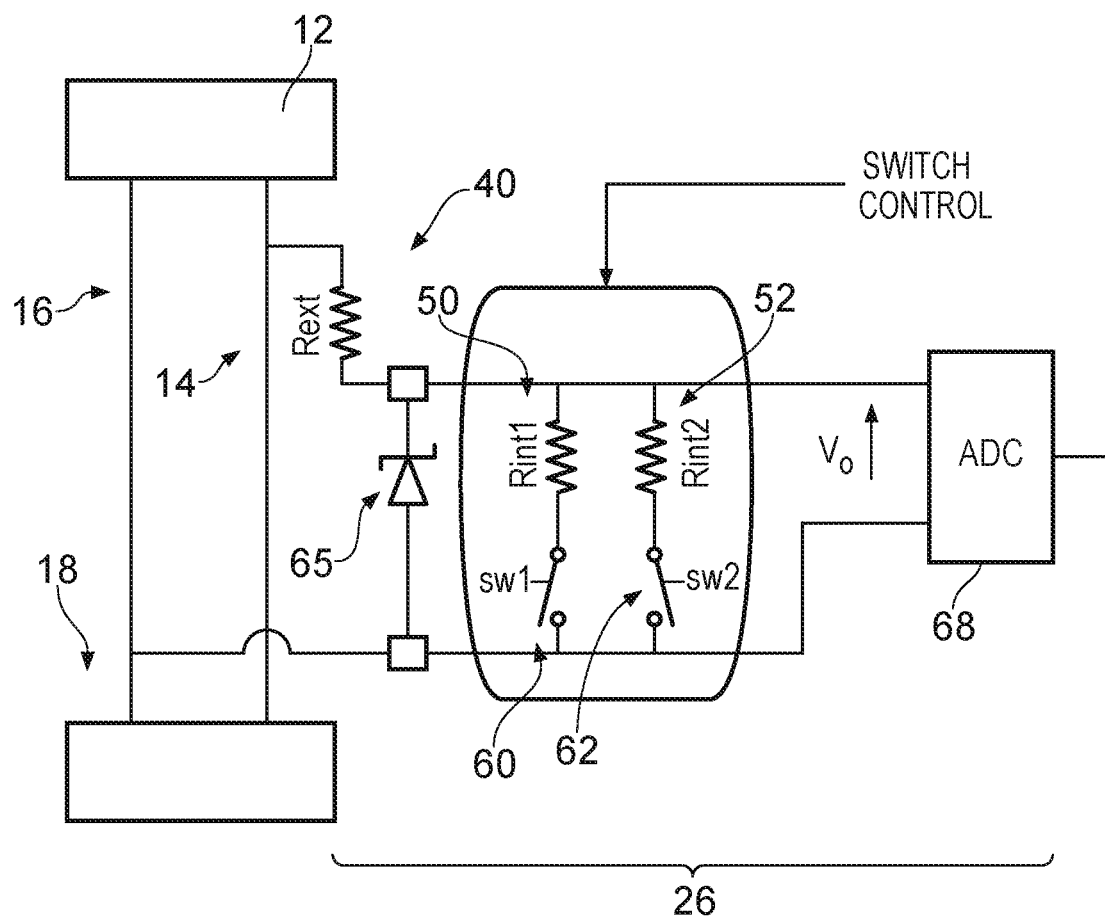
FIG. 4

MANAGING THE DETERMINATION OF A TRANSFER FUNCTION OF A MEASUREMENT SENSOR

FIELD OF THE DISCLOSURE

The present disclosure relates to apparatus, methods and systems for managing the determination of transfer functions of measurement sensors.

BACKGROUND

Utility meters measure the amount of a utility (such as electricity) being consumed by a user (for example, a domestic user, or a business user, etc). Where the utility meter is configured to measure electricity usage (an electricity consumption meter), known techniques for measuring electricity consumption include measuring current using at least one current measuring device (which may comprise, for example, a resistor shunt and/or a current transformer) and/or measuring voltage using a voltage measuring device (which may comprise, for example, a potential divider), using which consumed power and energy may be determined.

SUMMARY OF THE DISCLOSURE

However, changes to the current measuring device(s) and/or voltage measuring device(s) may result in inaccuracies in the measurements of current and/or voltage, and consequently inaccuracies in the determination of consumed power and energy. For example, the accuracy of the current measuring device and/or voltage measuring device may drift over time due to wear and aging, or the utility meter may develop a fault that results in the current measuring device and/or voltage measuring device giving inaccurate measurements, or a fraudulent user may tamper with the current measuring device and/or voltage measuring device in some way to try to reduce their utility bills, etc. To ensure that utility consumption is measured accurately and consistently, for the benefit of both the consumer and the utility provider, there is a desire to monitor the accuracy of the utility meter so that inaccuracies of any kind can be identified and investigated.

It is possible to monitor characteristics of measuring devices to monitor their accuracy. For example, estimates of the transfer function (also referred to as estimates of sensor size, or Gain, or CC) of a measuring device, such as a current measuring device or voltage measuring device, as well as a certainty value for each estimated transfer function (i.e., a value that quantifies the expected accuracy of an estimate of the transfer function) can be determined over time. Changes in these values over time can be used to identify changes in the accuracy of the measuring device (for example, changes due to sensor drift, or due to a tamper or attempted tamper event, etc).

However, in order to reliably monitor the accuracy of a measuring device, estimates of the transfer function and corresponding certainty value may need to be determined with great regularity (for example, in the order of seconds, such as on a second-by-second basis). This may be particularly important for the identification of tamper or attempted tamper events, which may only last for a very short period of time. Determining, processing and interpreting such a large amount of data may represent a significant challenge, particularly for utility meters that might typically have relatively low computing power, storage capacity and communication bandwidth.

In a first aspect of the present disclosure, there is provided a controller apparatus for controlling an operation of a monitor module of an electrical measurement system, the controller apparatus being configured to: select one of a plurality of monitor module operating states; and perform a control action for controlling the operation of the monitor module to implement the selected monitor module operating state, wherein the plurality of monitor module operating states comprises: a) monitor at least a first measurement sensor of the utility meter to determine a first monitor result comprising an estimate of a transfer function of the first measurement sensor (for example, a 'CC') and a corresponding certainty value (for example, a 'Cert') indicative of the accuracy of the estimate of the transfer function of the first measurement sensor, and b) do not monitor any measurement sensor of the electrical measurement system, wherein the first measurement sensor is for measuring a first electrical property.

If monitor module operating state a) is selected, the control action may comprise communicating a first control instruction to the monitor module to monitor the first measurement sensor for a first individual run length of time to determine the first monitor result.

The first individual run length of time may be a fixed length of time or a variable length of time.

If the first individual run length of time is a variable length of time, the controller apparatus may be configured to determine the first individual run length of time. Preferably, the controller apparatus is configured to determine the first individual run length of time based at least in part on one or more previously determined certainty values corresponding to a respective one or more previously determined estimates of the transfer function of the first sensor. The controller apparatus may be configured to determine the first individual run length of time in order to achieve a desired level of accuracy for the estimate of the transfer function of the first measurement sensor by comparing one or more previously determined certainty values corresponding to a respective one or more previously determined estimates of the transfer function of the first sensor against a target certainty value.

If the one or more previously determined certainty values fails to achieve the target certainty value, the first individual run length of time may be set to be greater than the one or more individual run lengths of time that were used in the determination of the one or more previously determined estimates of the transfer function of the first measurement sensor. If the one or more previously determined certainty values betters the target certainty value, the first individual run length of time may be set to be less than the one or more individual run lengths of time that were used in the determination of the one or more previously determined estimates of the transfer function of the first measurement sensor.

Preferably, the controller apparatus is further configured to select one of the plurality of monitor module operating states based at least in part on one or more previously determined certainty values corresponding to a respective one or more previously determined estimates of the transfer function of the first measurement sensor.

Preferably, the controller apparatus is further configured to select one of the plurality of monitor module operating states such that the proportion of time spent by the monitor module determining monitor results relating to the first measurement sensor during a monitoring time window is sufficient for estimates of the transfer function of the first measurement sensor determined by the monitor module during the monitoring time window to achieve a desired level of accuracy.

The controller apparatus may be configured to select one of the plurality of monitor operating states by: determining a first utilisation target based on the one or more previously determined certainty values, wherein the first utilisation target is indicative of a target total proportion of the monitoring time window to be spent by the monitor module determining monitor results relating to the first measurement sensor; and selecting one of the plurality of monitor operating states based at least in part on the first utilisation target.

Determining the first utilisation target may comprise: comparing the one or more previously determined certainty values against a target minimum level of accuracy to be achieved for the estimate of the transfer function of the first measurement sensor, and if the one or more previously determined certainty values fails to achieve the target minimum level of accuracy, setting the first utilisation target to be greater than a previous first utilisation target that was in place during determination of the one or more previously determined estimates of the transfer function of the first sensor.

Additionally, or alternatively, determining the first utilisation target may comprise: comparing the one or more previously determined certainty values against a target maximum level of accuracy, and if the one or more previously determined certainty values betters the target maximum level of accuracy, setting the first utilisation target to be less than a previous first utilisation target that was in place during determination of the one or more previously determined estimates of the transfer function of the first measurement sensor.

Selecting one of the plurality of monitor module operating states may comprise comparing the first utilisation target against a current first utilisation, wherein the current first utilisation is indicative of a proportion of the monitoring time window that has already been spent by the monitor module determining monitor results relating to the first measurement sensor. Selecting one of the plurality of monitor module operating states may further comprise selecting operating state a) if the current first utilisation is less than the target first utilisation.

The plurality of monitor module operating states may further comprise: c) monitor at least a second measurement sensor of the electrical measurement system to determine a second monitor result comprising an estimate of the transfer function of the second measurement sensor and a corresponding certainty value indicative of the accuracy of the estimate of the transfer function of the second measurement sensor, wherein the second measurement sensor is for measuring a second electrical property.

If monitor module operating state c) is selected, the control action may comprise communicating a second control instruction to the monitor module to monitor the second measurement sensor for a second individual run length of time to determine the second monitor result.

The second individual run length of time may be a fixed length of time or a variable length of time.

If the second individual run length of time is a variable length of time, the controller apparatus may be further configured to determine the second individual run length of time. Preferably, the controller apparatus is configured to determine the second individual run length of time based at least in part on the one or more previously determined certainty values corresponding to a respective one or more previously determined estimates of the transfer function of the second measurement sensor.

The controller apparatus may be further configured to select one of the plurality of monitor module operating states based at least in part on one or more previously determined certainty values corresponding to a respective one or more previously determined estimates of the transfer function of the second measurement sensor.

The controller apparatus may be further configured to select one of the plurality of monitor module operating states based at least in part on a first target level of accuracy for estimates relating to the first measurement sensor and/or a second target level of accuracy for estimates relating to the second measurement sensor.

The controller apparatus may be further configured to select one of the plurality of monitor module operating states to optimise the proportion of time spent by the monitor module determining monitor results relating to the first measurement sensor during a monitoring time window and the proportion of time spent by the monitor module determining monitor results relating to the second measurement sensor during the monitoring time window based on the first target level of accuracy and the second target level of accuracy.

The controller apparatus may be further configured to select one of the plurality of monitor operating states by determining a first utilisation target based on one or more previously determined certainty values corresponding to the respective one or more previously determined estimates of the transfer function of the first sensor, wherein the first utilisation target is indicative of a target total proportion of the monitoring time window to be spent by the monitor module determining monitor results relating to the first measurement sensor of the electrical measurement system; determining a second utilisation target based on the one or more previously determined certainty values corresponding to the respective one or more previously determined estimates of the transfer function of the second sensor, wherein the second utilisation target is indicative of a target total proportion of the monitoring time window to be spent by the monitor module determining monitor results relating to the second measurement sensor of the electrical measurement system; and selecting one of the plurality of monitor operating states based at least in part on the first utilisation target and the second utilisation target.

Selecting one of the plurality of monitor module operating states may comprise comparing the first utilisation target against a current first utilisation and comparing the second utilisation target against a current second utilisation, wherein the current first utilisation is indicative of a proportion of the monitoring time window that has already been spent by the monitor module determining monitor results relating to the first measurement sensor, and wherein the current second utilisation is indicative of a proportion of the monitoring time window that has already been spent by the monitor module determining monitor results relating to the second measurement sensor.

The controller apparatus may be further configured to select operating state a) if either of the following occurs: (i) the current first utilisation is less than the first utilisation target and the current second utilisation is greater than the second utilisation target; (ii) the current first utilisation is less than the first utilisation target and the current second utilisation is less than the second utilisation target and the difference between the current first utilisation and the first utilisation target is greater than the difference between the current second utilisation and the second utilisation target;

and select operating state c) if either of the following occurs: (iii) the current second utilisation is less than the second utilisation target and the current first utilisation is greater than the first utilisation target; (iv) the current first utilisation is less than the first utilisation target and the current second utilisation is less than the second utilisation target and the difference between the current second utilisation and the second utilisation target is greater than the difference between the current first utilisation and the first utilisation target.

In a second aspect of the present disclosure, there is provided an electrical measurement system for measuring at least one electrical property, the electrical measurement system comprising: a first measurement sensor for measuring a first electrical property; a monitor module configured to operate in one of a plurality of monitor module operating states comprising: a) monitor at least the first measurement sensor to determine a first monitor result comprising an estimate of a transfer function of the first measurement sensor and a corresponding certainty value indicative of the accuracy of the estimate of the transfer function of the first measurement sensor, and b) do not monitor any measurement sensor of the electrical measurement system. The electrical measurement system also comprises a controller configured to: select one of the plurality of monitor module operating states; and perform a control action for controlling the operation of the monitor module to implement the selected monitor module operating state. The electrical measurement system may be a utility meter.

In a third aspect of the present disclosure, there is provided a method of controlling a monitor module of an electrical measurement system, the method comprising: selecting one of a plurality of monitor module operating states; and performing a control action for controlling the operation of the monitor module to implement the selected monitor module operating state, wherein the plurality of monitor module operating states comprises: a) monitor at least a first measurement sensor of the electrical measurement system to determine a first monitor result comprising an estimate of a transfer function of the first measurement sensor and a corresponding certainty value indicative of the accuracy of the estimate of the transfer function of the first measurement sensor, and b) do not monitor any measurement sensor of the electrical measurement system, wherein the first measurement sensor is for measuring a first electrical property.

In a fourth aspect of the present disclosure, there is provided a non-transitory computer readable medium storing computer readable instructions that, when executed by at least one processor, cause the at least one processor to perform the method of the third aspect.

In a fifth aspect of the present disclosure, there is provided a firmware module configured to cause one or more processors to execute the method of the third aspect.

The following further aspects are also disclosed:

A manager apparatus for use in an electrical measurement system, wherein the electrical measurement system comprises a first measurement sensor for measuring a first electrical property and a monitor module configured to determine an estimate of a transfer function of the first measurement sensor, wherein the manager apparatus is configured to: output a first control instruction for instructing the monitor module to determine an estimate of the transfer function of the first measurement sensor over a first individual run length of time; obtain a first monitor result from the monitor module, the monitor result comprising the estimate of the transfer function of the first measurement sensor (for example, 'CC' for the first measurement sensor); and generate a report based at least in part on the first monitor result.

Preferably, the first monitor result further comprises a certainty value (for example, 'Cert') indicative of the accuracy of the estimate of the transfer function of the first sensor.

The first control instruction may be configured to control at least one of a start time of the first individual run length of time and/or a time duration of the first individual run length of time and/or a power mode to be used in the determination of the first monitor result.

The electrical measurement system may further comprise a second measurement sensor for measuring a second electrical property, and wherein the monitor module is further configured to determine an estimate of a transfer function of the second measurement sensor, wherein the manager apparatus is further configured to: output a second control instruction for instructing the monitor module to determine an estimate of the transfer function of the second measurement sensor over a second individual run length of time; obtain a second monitor result from the monitor module, the second monitor result comprising the estimate of the transfer function of the second measurement sensor; and generate the report based at least in part on the first monitor result and the second monitor result.

The second control instruction may be configured to control at least one of: a start time of the second individual run length of time and/or a time duration of the second individual run length of time and/or a power mode to be used in the determination of the second monitor result.

The manager apparatus may be further configured to: output one or more further control instructions for instructing the monitor module to determine one or more further estimates of the transfer function of the first measurement sensor over one or more further individual run lengths of time; obtain one or more further monitor results from the monitor module, each further monitor result comprising one of the further estimates of the transfer function of the first measurement sensor; and generate the report based at least in part on the first monitor result and the obtained one or more further monitor results.

The one or more further control instructions are configured to control at least one of: a start time of each of the one or more further individual run lengths of time and/or a time duration of each of the one or more further individual run lengths of time and/or a power mode to be used in the determination of each of the one or more estimates of the transfer function of the first measurement sensor.

The manager apparatus may be further configured to determine the first control instruction based at least in part on static monitor settings. The static monitor settings may comprise at least one of: a channel of interest setting, indicative of one or more measurement sensors whose transfer functions are to be monitored; a channel priority setting, indicative of a target minimum level of accuracy to be achieved for estimates of the transfer function of the first sensor; a power consumption setting, indicative of a desired level of power consumption for the monitor module in determining transfer functions; a minimum run length setting indicative of a minimum period of time for individual run lengths of time; a maximum run length setting indicative of a maximum period of time for individual run lengths of time.

Preferably, the manager apparatus is further configured to determine the first control instruction based at least in part on one or more previously determined monitor results, wherein each of the one or more previously determined monitor results comprises an estimate of the transfer function of the first sensor. Each of the one or more previously determine monitor results may further comprise a certainty value indicative of the accuracy of the estimate of the transfer function of the first sensor.

The manager apparatus may be further configured to generate reports periodically. The manager apparatus may be configured to generate periodic reports based at least in part on monitor results obtained during a preceding reporting period of time.

Additionally, or alternatively, the manager apparatus may be further configured to: determine whether or not the first monitor result meets an alert condition; and if the first monitor result meets the alert condition, generate the report based at least in part on the first monitor result. The alert condition may comprise an alert threshold, wherein if a difference between the estimate of the transfer function of the first measurement sensor and a benchmark transfer function value exceeds the alert threshold, the alert condition is met.

The manager apparatus may further comprise a communications module for interfacing with a utility network entity over a communications network, wherein the manager apparatus is further configured to output the report for communication to the utility network entity via the communications module.

The electrical measurement system may further comprise a communications module for interfacing with a utility network entity over a communications network, and wherein the manager apparatus is further configured to: receive from the utility network entity, via the communications module, an on-demand report request; and output the report for communication to the utility network entity via the communications module. The manager apparatus may be further configured to generate the report based at least in part on the first monitor result after receiving from the utility network entity the on-demand report request.

The on-demand report request may comprise an on demand report setting, and wherein the manager apparatus is further configured to generate the report based at least in part on the first monitor result and the on demand report setting. The on-demand reporting setting may comprise at least one of: an on-demand reporting period identifier, indicative of a time period to which the report should relate and/or an on-demand report length identifier, indicative of a data size that the report should have.

The data size of the report may be less than the combined data size of the monitor results on which it is based (for example, the report may be derived from the monitor results, so that the report has a smaller data size than the combined size of the monitor results).

Alternatively, the report may comprise the monitor results on which it is based, in which case the data size of the report may not be smaller than the combined data size of the monitor results.

An electrical measurement system for measuring at least one electrical property, the electrical measurement system comprising: a first measurement sensor for measuring a first electrical property; a monitor module configured to determine an estimate of a transfer function of the first measurement sensor; and a manager apparatus configured to: output a first control instruction for instructing the monitor module to determine an estimate of the transfer function of the first measurement sensor over a first individual run length of time; obtain a first monitor result from the monitor module, the first monitor result comprising the first estimate of the transfer function of the first measurement sensor; and generate a report based at least in part on the first monitor result. The electrical measurement system may be a utility meter.

The electrical measurement system may further comprise a communications module for interfacing with a utility network entity over a communications network, wherein the manager apparatus is further configured to output the report for communication to the utility network entity via the communications module.

A method of managing the determination of a transfer function of a first measurement sensor for measuring a first electrical property, the method comprising: instructing a monitor module to determine an estimate of a transfer function of the first measurement sensor over a first individual run length of time; obtaining a first monitor result from the monitor module, the first monitor result comprising the first estimate of the transfer function of the first measurement sensor; and generating a report based at least in part on the first monitor result. Also disclosed is a non-transitory computer readable medium storing a program for causing one or more processors to execute the method. Also disclosed is a firmware module configured to cause one or more processors to execute the method.

A profiler apparatus for use in an electrical measurement system, the profiler apparatus comprising: a profile analyser configured to obtain a plurality of profiling results each comprising an estimate of a transfer function of a measurement sensor of the electrical measurement system (for example, a 'CC') and a corresponding certainty value (for example, a 'Cert') indicative of the accuracy of the estimate of the transfer function, wherein the plurality of profiling results are based on estimates of the transfer function of the measurement sensor and corresponding certainty values that were determined by a monitor module of the electrical measurement system during a profiling period of time; and generate a profiling summary based on at least one of the plurality of profiling results, wherein the measurement sensor is for measuring an electrical property.

The profiling summary may be indicative of at least one of: an effective average of the estimates of the transfer function in the plurality of profiling results; an effective average of the certainty values in the plurality of profiling results; a difference between an effective average of the estimates of the transfer function in the plurality of profiling results and a benchmark transfer function value; the number of profiling results in the plurality of profiling results; and/or a proportion of the profiling period of time that was spent by the monitor module determining the estimates of the transfer function and corresponding certainty values.

The profiler apparatus may be configured to determine an effective average of the estimates of the transfer function based at least in part on the plurality of estimates of the transfer function and the corresponding plurality of certainty values. Determination of the effective average of the estimates of the transfer function may comprise weighting each of the plurality of estimates of the transfer function based on their corresponding certainty value; and determining the effective average of the estimates of the transfer function based at least in part on the weighted plurality of estimates of the transfer function.

Preferably, the profiler apparatus is further configured to identify, based at least in part on the plurality of profiling results, a sensor event that took place during the profiling period of time. The profiling summary may comprise an indication of the sensor event.

Identifying a sensor event may be based at least in part on the estimate of the transfer function in at least some of the plurality of profiling results.

Identifying a sensor event may comprises comparing the estimate of the transfer function in at least some of the plurality of profiling results against a benchmark transfer function value, wherein a profiling result comprising an estimate of the transfer function that is different from the benchmark transfer function value by more than an event threshold amount is indicative of a sensor event that took place during the profiling period of time. If a profiling result is determined to be indicative of a sensor event, the profiling summary may comprise an indication of a magnitude of the difference between the benchmark transfer function and the estimate of the transfer function in that profiling result.

A profiling result comprising an estimate of the transfer function that is different from the benchmark transfer function value by more than a max difference threshold may be indicative of signal failure sensor event.

Preferably, identifying a sensor event is further based at least in part on the certainty value in at least some of the plurality of profiling results. In this case, identifying a sensor event may comprise comparing the certainty value in one or more of the plurality of profiling results a threshold minimum level of accuracy. The threshold minimum level of accuracy may be based on the event threshold amount.

A profiling result comprising an estimate of the transfer function that is different from a benchmark transfer function value by more than the event threshold amount and a corresponding certainty value indicative of an accuracy of the estimate of the transfer function that achieves the minimum level of accuracy may be indicative of a sensor event that took place during the profiling period of time.

If an effective average of the certainty values in the plurality of profiling results is indicative of an accuracy that fails to meet the threshold minimum level of accuracy, an accuracy failure sensor event may be identified.

The sensor event may comprise a burst event indicative of a temporary change in the transfer function during the profiling period of time. The profile analyser may be further configured to determine at least one of a start time of the burst event and/or a duration of the burst event, and the profiling summary may comprise an indication of at least one of the start time of the burst event and/or the duration of the burst event.

The sensor event may comprise a change event indicative of a lasting change in the transfer function during the profiling period of time. The profile analyser may be further configured to determine, a time at which the change event occurred, and the profiling summary record may comprise an indication of the time at which the change event occurred.

The profiler apparatus may comprise a data store manager configured to obtain from the monitor module of the electrical measurement system a plurality of monitor results, wherein each of the plurality of monitor results comprises: an estimate of the transfer function of the measurement sensor that was determined by the monitor module over an individual run length of time that is within the profiling period of time, and a corresponding certainty value indicative of the accuracy of the estimate of the transfer function, wherein the data store manager is further configured to determine the plurality of profiling results based at least in part on the plurality of monitor results.

The data store manager may be configured to determine at least one of the profiling results of the plurality of profiling results by identifying two or more monitor results that were determined over successive periods of time; determining the estimate of the transfer function for the profiling result based at least in part on the estimates of the transfer function in the identified two or more monitor results; and determining the certainty value for the profiling result based at least in part on the certainty values in the identified two or more monitor results. The identified two or more monitor result may comprise certainty values that all better a threshold minimum level of certainty. Additionally, or alternatively, the identified two or more monitor results may comprise estimates of the transfer function that are all within an averaging threshold of each other. The averaging threshold may be based at least in part on the certainty value in at least one of the plurality of monitor results.

A manager system for use in an electrical measurement system, the manager system comprising: the profiler apparatus of the first aspect, and a report generator configured to generate, based at least in part on the profiling summary, a report for communication to a network entity.

The report generator may be further configured to: receive from the network entity an on-demand reporting request; generate the report based at least in part of the profiling summary; and output the on-demand report for communication to the network entity.

The profiler apparatus may be further configured to identify, based at least in part on the plurality of profiling results, a sensor event that took place during the profiling period of time, and wherein the report generator may be further configured to, when a sensor event is identified by the profiler apparatus, generate the report based at least in part on the profiling summary.

The report may comprise at least part of the profiling summary.

The report generator may be further configured to generate the report based at least in part on at least one measurement of the electrical property determined by the measurement sensor and/or at least one measurement of a further property relating to the electrical measurement system.

The manager system may further comprise a secondary profiler configured to: generate a secondary profiling summary based at least in part on at least one measurement of the electrical property determined by the measurement sensor and/or at least one measurement of a further property relating to the electrical measurement system, wherein the report generator is further configured to generate the report based at least in part on at least one measurement of the electrical property determined by the measurement sensor. The further property relating to the electrical measurement system may comprise a temperature of the electrical measurement system.

An electrical measurement system for measuring at least one electrical property, the electrical measurement system comprising: a measurement sensor for measuring a first electrical property; a monitor module configured to determine an estimate of a transfer function of the first measurement sensor and a corresponding certainty value indicative of the accuracy of the estimate of the transfer function; and a profile analyser configured to: obtain a plurality of profiling results each comprising an estimate of a transfer function of the measurement sensor and a corresponding certainty value indicative of the accuracy of the estimate of the transfer function, wherein the plurality of profiling results are based on estimates of the transfer function of the measurement sensor and corresponding certainty values that were determined by the monitor module of the electrical measurement system during a profiling period of time; and generate a profiling summary based on at least one of the plurality of profiling results. The electrical measurement system may be a utility meter.

A method of generating a measurement sensor profiling summary in relation to a measurement sensor of an electrical measurement system, the method comprising: obtaining a plurality of profiling results each comprising an estimate of a transfer function of the measurement sensor and a corresponding certainty value indicative of the accuracy of the estimate of the transfer function, wherein the plurality of profiling results are based on estimates of the transfer function of the measurement sensor and corresponding certainty values that were determined by a monitor module of the electrical measurement system during a profiling period of time; and generating a profiling summary record based on at least one of the plurality of profiling results, wherein the measurement sensor is for measuring an electrical property. Also disclosed is a non-transitory computer readable medium storing computer readable instructions that, when executed by at least one processor, cause the at least one processor to perform the method. Also disclosed is a firmware module configured to cause one or more processors to execute the method.

BRIEF DESCRIPTION OF THE DRAWINGS

The present disclosure is described, by way of example only, with reference to the following drawings, in which:

FIG. 4 schematically illustrates one embodiment of an apparatus for overcoming the problem with the unknown transfer function;

DETAILED DESCRIPTION

Electrical measurement systems, such as utility meters, may comprise a measurement front end and a microcontroller unit (MCU). The measurement front end may measure electrical parameters (for example, voltage and/or current) and potentially also calculate the amount of electricity consumed based on the measurements of the electrical parameters. The MCU may perform many functions, such as setup of the measurement front end, reading results from the measurement front end, driving any local display on the electrical measurement system, enabling batter backup systems, operating a real-time clock (RTC), etc.

Aspects of the present disclosure are described below in the context of utility meter systems. However, it will be appreciated that the present disclosure is not limited only to that context and may be applied to any type of electrical measurement system.

Figure 1:
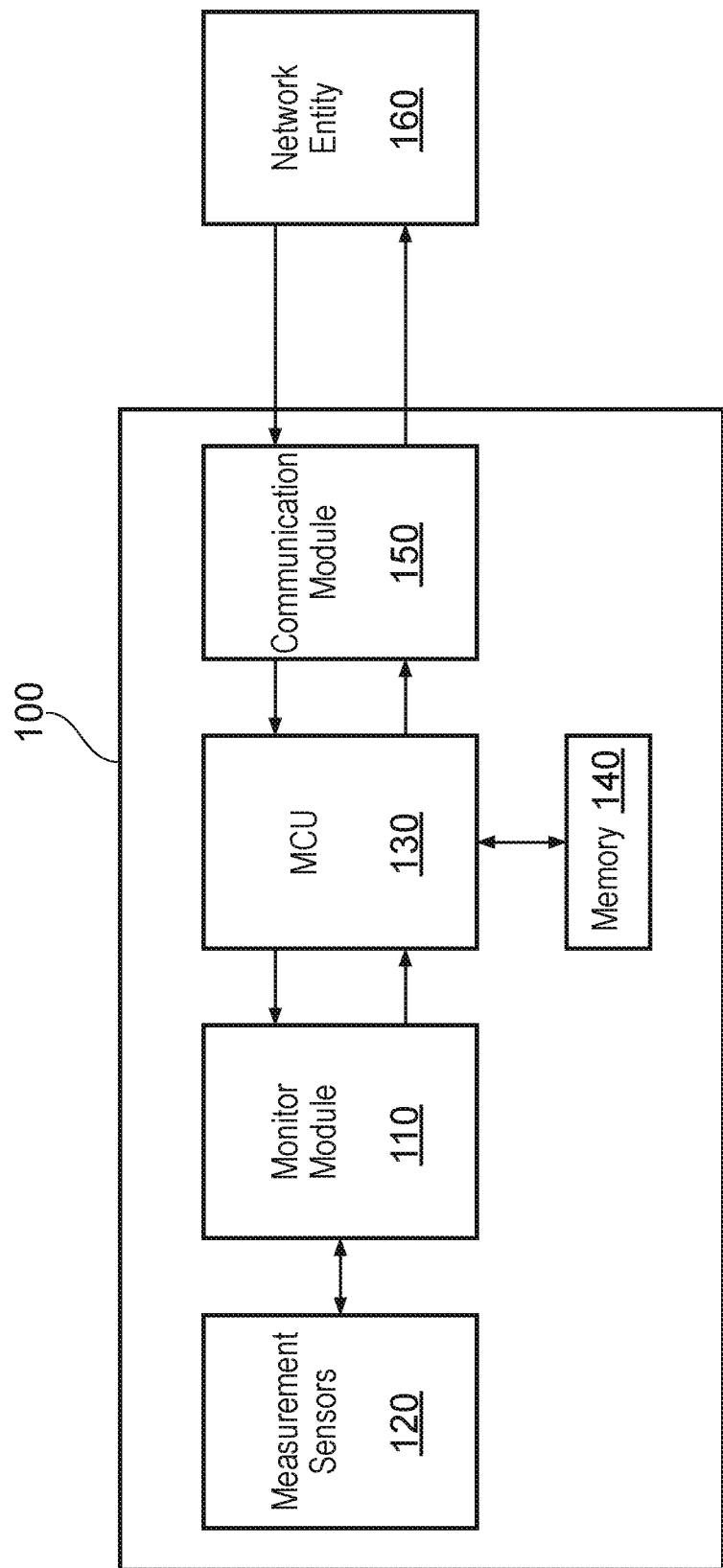
FIG. 1 schematically illustrates components within an electricity consumption meter.

FIG. 1 schematically illustrates a utility meter system 100 in accordance with a first aspect of the present disclosure. The utility meter system 100 comprises a monitor module 110, measurement sensors 120, an MCU 130, memory 140 and a communications module 150. The utility meter system 100 is configured to interface with a network entity 160 (for example, the utility cloud) using the communications module 150.

The communications module 150 may be configured in accordance with any one or more wired or wireless communications protocols, standards or architectures, such as Ethernet, Bluetooth®, WiFi, WiMAX, GSM, GPRS, EDGE, UMTS, LTE, such that communications between the network entity 160 and the utility meter system 100 may take place via the communications module 150 in accordance with any one or more of those protocols, standards or architectures.

The memory 140 may comprise any suitable form of memory, such as volatile and/or non-volatile memory, for example RAM, ROM, Flash memory, Solid-state memory, magnetic tape, hard disk drive, etc.

As will become apparent later, the measurement sensors 120 may form part of the measurement front end, described above.

The monitor module 110 is configured to determine an estimate of the transfer function (also referred to as an estimate of sensor size or Gain, and is referred to from hereon as the 'CC') for one or more of the measurement sensors 120 and a corresponding certainty value for each estimate (referred to from hereon as 'Cert'). Further details of the CC and Cert values will become apparent later in this disclosure. Whilst the implementation details of how the monitor module 110 may determine the CC and Cert are not the subject of the present disclosure, it may nevertheless be helpful first to describe example configurations of how the utility consumption meter 100 may be configured to measure power consumption (i.e., the measurement frontend) and how the monitor module 110 may determine CC and Cert.

Figure 2:
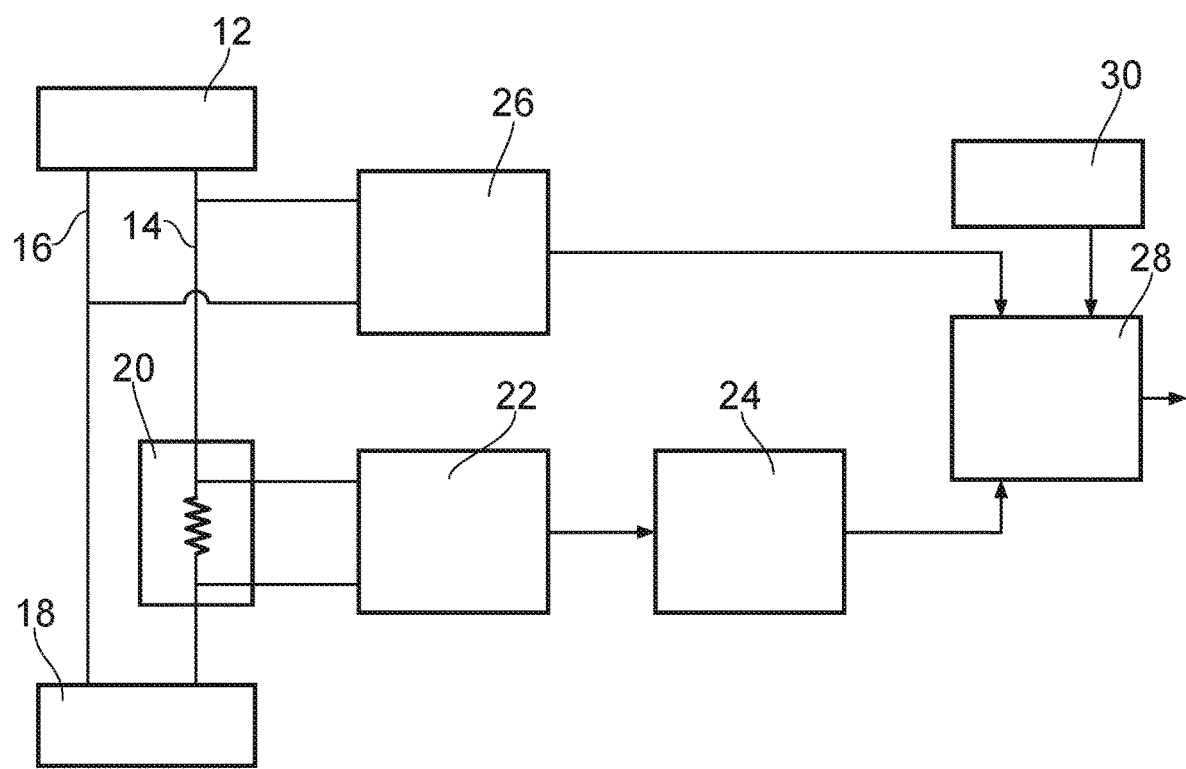
FIG. 2 schematically illustrates example current and voltage measurement components.

FIG. 2 schematically illustrates an example power measurement apparatus which may form part of the utility meter system 100 (i.e., the measurement frontend of a utility meter system 100). In this example, a single phase mains alternating current electricity supply 12 having a live conductor 14 and neutral conductor 16 supplies a load 18. The amount of power consumed by the load 18 depends on the voltage between the live and neutral conductors 14 and 16, the current drawn by the load 18, and a phase angle between the alternating voltage waveform and the alternating current waveform for a sinusoidal voltage current. For more complex waveforms where, for example, there are significant harmonic components present in the amount of current drawn, the power consumption should be measured by keeping a running sum of the instantaneous power consumed.

In order to measure the current, the power measurement apparatus has a measurement sensor which, in this example, is a shunt resistor 20 of nominally known resistance in the conductive path represented by the live conductor 14 between the load 18 and the electricity supply 12. Typically the shunt resistance is of a very low value, typically in the order of a milliohm or so. The voltage dropped across the shunt resistor 20 is proportional to the current passing through it. As a result, the shunt resistance can be regarded as having a current to voltage transfer function. Consequently an estimate of the current in the conductor 14 can be reliably made by a voltage measurement apparatus 22 arranged to measure the voltage across the shunt resistor 20 and to provide its output to a signal processing circuit 24, provided that the resistance of resistor 20 is well known, or more accurately, providing that the transfer function of the items 20 and 22 are well known. The measurement apparatus 22 may include programmable gain amplifiers to change a gain applied to the current signal to allow an analog to digital converter with a modest dynamic range to cope with a range of currents from very small to very large without losing resolution, at least in respect of smaller current flows. Thus, it will be appreciated that the measurement sensors 120 of FIG. 1 may comprise the live conductor current measurement items (i.e., the shunt resistor 20 and measurement apparatus 22). The current in the live conductor 14, or phase current, is referred to from hereon as $I_A$.

Whilst not represented in FIG. 2, the power measurement apparatus may additionally or alternatively be configured to measure the current in the neutral conductor 16, in a similar way as that described above for the live conductor 14. It may likewise use a shunt resistor in the current path of the neutral conductor as a measurement sensor, or may alternatively use any other suitable measurement sensor, such as a current transformer (CT). Thus, it will be appreciated that the measurement sensors 120 of FIG. 1 may additionally or alternatively comprise neutral conductor current measurement items (i.e., a shunt resistor or CT, and measurement apparatus). The current in the neutral conductor 16, or neutral current, is referred to from hereon as $I_B$.

Additionally, a voltage measurement apparatus 26 is provided to measure the voltage difference between the live conductor 14 and the neutral conductor 16. In a domestic environment that voltage would generally be in the range of 115 to 250 volts RMS, and hence may experience peak voltages in excess of 300 volts. Consequently the voltage measurement apparatus 26 often includes a potential divider, as will be discussed in more detail with respect to FIG. 3, in order to transform the input voltage from the mains voltage domain to a smaller voltage domain more suitable for signal acquisition by, for example, an analog to digital converter within the voltage measurement apparatus 26. Thus, it will be appreciated that the measurement sensors 120 of FIG. 1 may comprise the voltage measurement apparatus 26.

The voltage measurement apparatus 26 may include programmable voltage attenuators and/or programmable amplifiers such that a single design of measurement circuit can be used in installations or countries having different supply voltages. The instantaneous measurements of voltage and current from the voltage measurement apparatus 26 and the current measurement apparatus 20, 22, 24 may be provided to a computational unit 28 adapted to calculate the root mean square power taken by the load 18 from the supply 12, and optionally to multiply that by a tariff such that the consumer who operates load 18 may be appropriately charged for the amount of power that they have received from the electricity source 12. The computational unit 28 may be associated with a real time clock 30 such that each voltage and current measurement is properly allocated in the time domain for a true and appropriate calculation of power consumption.

Figure 3:
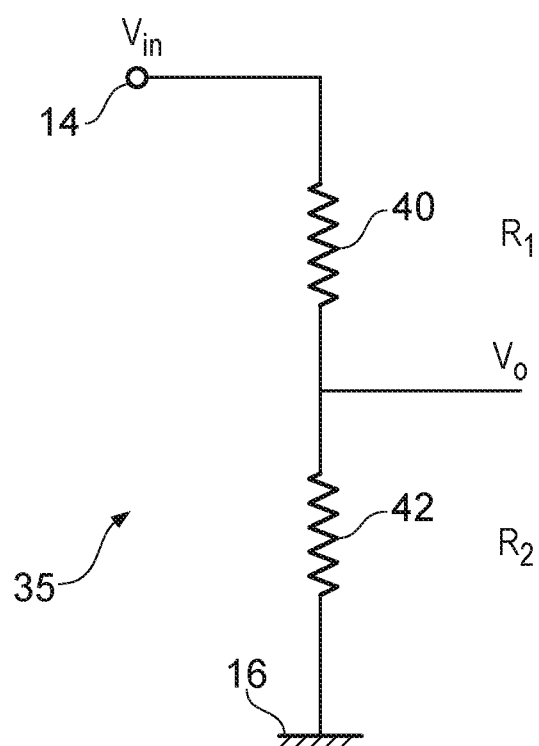
FIG. 3 schematically illustrates a potential divider to consider how its transfer function may not be well known.

FIG. 3 schematically illustrates a resistor for potential divider 35 receiving an input voltage Vin from conductor 14 and dividing it down with reference to the neutral voltage provided at conductor 16. In this example first and second resistors 40 and 42 are connected in series between the conductors 14 and 16. The same current flows through each resistor and hence the output voltage Vo can be related to the input voltage Vin by $$Vo=(Vin.R2)/(R1+R2)$$

where R1 is a value of the resistor 40 and R2 is the value of the resistor 42. Thus, the potential divider has a transfer function set by the relative values of resistors R1 and R2. In order to accurately know the voltage one should accurately know the transfer function of the potential divider. The measured voltage, or phase voltage, is referred to from hereon as $V_A$.

It will be appreciated that whilst the above describes the utility meter system 100 comprising power measurement apparatus configured to measure $I_A$ and/or $I_B$ and $V_A$, it may alternatively be configured to measure any one or more of $I_A$, $I_B$ and/or $V_A$. Furthermore, whilst the above describes a particular configuration of power measurement apparatus for measuring $I_A$, $I_B$ and/or $V_A$, the present disclosure is not so limited and the utility consumption meter 100 may be configured to measure $I_A$ and/or $I_B$ and/or $V_A$ in any suitable way.

The measurement sensors 120 may therefore comprise one or more items for measuring any one or more of $I_A$, $I_B$ and/or $V_A$. For example, the measurement sensors 120 may comprise one or more shunt resistors and measurement apparatus 22 for measuring $I_A$ and/or $I_B$, one or more current transformers (CT) and measurement apparatus 22 for measuring $I_A$ and/or $I_B$, and/or one or more voltage measurement apparatus 26 for measuring $V_A$.

The monitor module 110 is configured to determine estimates of the transfer functions (CC) of the measurement sensors 120. It may be configured to determine a CC of the measurement sensor for measuring $I_A$ (for example, a shunt resistor/CT and measurement apparatus 22) and/or the measurement sensor for measuring $I_B$ (for example, a shunt resistor/CT and measurement apparatus 22) and/or the measurement sensor for measuring $V_A$ (for example, the voltage measurement apparatus 26). Ways to determine estimates of transfer functions are described in WO2014/072733 and WO2013/038176 to which the reader is referred for enabling disclosures as to how to estimate the voltage and current transfer functions and which are incorporated in their entirety herein by reference. However, for ease of reference, examples of those patent applications are included herein.

In WO2014/072733, an estimate of the transfer function for the voltage measurement circuit can be determined by several approaches. One approach as shown in FIG. 4, is to provide two resistors 50 and 52 having accurately known values ($R_{int}1$ and $R_{int}2$) such that either may form a potential divider with an external resistance, $R_{ext}$, which represents the first resistor 40 in FIG. 3. By forming successive potential dividers between resistor 40 and resistor 50, and then resistor 40 and resistor 52 under the control of series connected switches 60 and 62, different divide ratios are formed, and provided that the value of resistors 50 and 52 are well known, then an estimate of the transfer function of the potential divider can be determined. The switches 60 and 62 are driven in antiphase during calibration, whereas in normal use one switch, for example SW1, is left on whereas the other is off so as to keep the divide ratio of the potential divider nominally constant.

A protection device, such as a Zener diode 65, may be provided to limit the maximum voltage (both forward and reverse) that can occur across the resistors 50 and 52, for example due to a failure of one of the switches 60 and 62, although these are likely to be implemented as field effect transistors. The output voltage $V_O$ is measured by an ADC 68.

Figure 5:
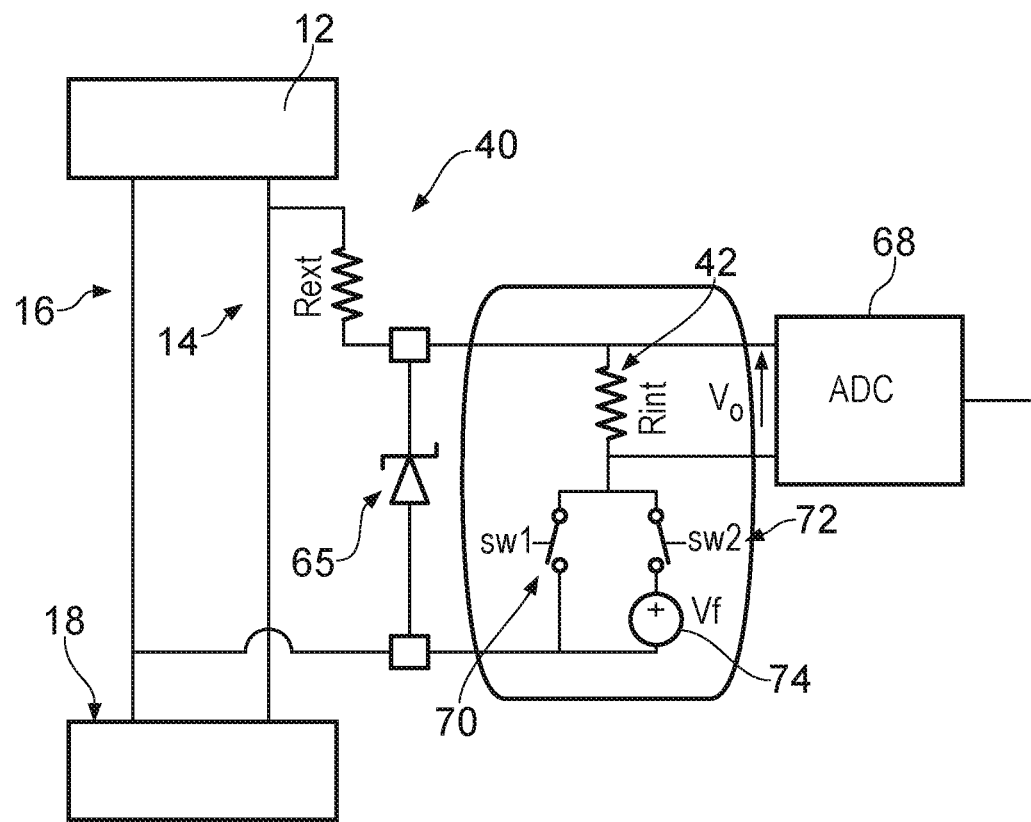
FIG. 5 schematically illustrates a second apparatus for measuring voltage.
Figure 6:
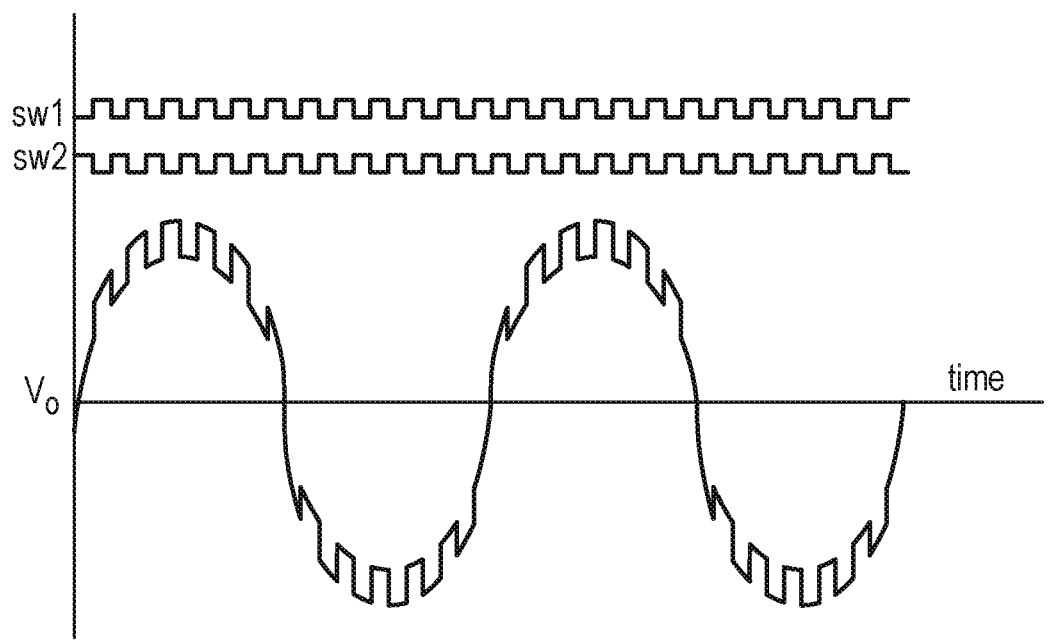
FIG. 6 schematically illustrates the output signal $V_O$ from the apparatus of FIG. 5.

Another approach as shown in FIG. 5 is to sequentially modify a voltage across a potential divider. It is most conveniently performed by modifying the voltage acting between R2 and the local ground. Such an arrangement is shown in FIG. 5 where the resistors 40 and 42 are again provided in series to create a potential divider. However, the end of resistor 42 not connected to the resistor 40 can sequentially be connected to ground, either directly by way of a first switch 70, or to ground by way of a voltage source 74 in series with a second switch 72. Thus, as shown in FIG. 6, by sequentially switching switches S1 and S2, the voltage at the output of the potential divider is modulated. Given that the value of the voltage 74 is known to within a predetermined level of certainty (as specified by the designer), then provided the value of the second resistor 42 is known then an estimate of the transfer function of the voltage divider can be determined. Furthermore, it follows that if the voltage 74 can provide two or more controllable output voltages, then an estimate of the transfer function of the potential divider formed by resistors 40 and 42 can be determined without knowing the value of either resistor 40 or 42. The output voltage Vo is then provided to an analog to digital convertor 68 for conversion into the digital domain before being provided to subsequent circuits, such as a digital filter 24. The voltage source and switches may be associated with, for example, an operational amplifier forming the ground voltage for resistor 42.

The techniques described here, or others in WO2014/072733, can be used interchangeably in the practice of the present disclosure and are appropriate to either single phase or multiphase systems.

Similarly, as noted above, the monitor module 110 may also be configured to determine the CC of the measurement sensor(s) for measuring $I_A$ and/or $I_B$.

Figure 7:
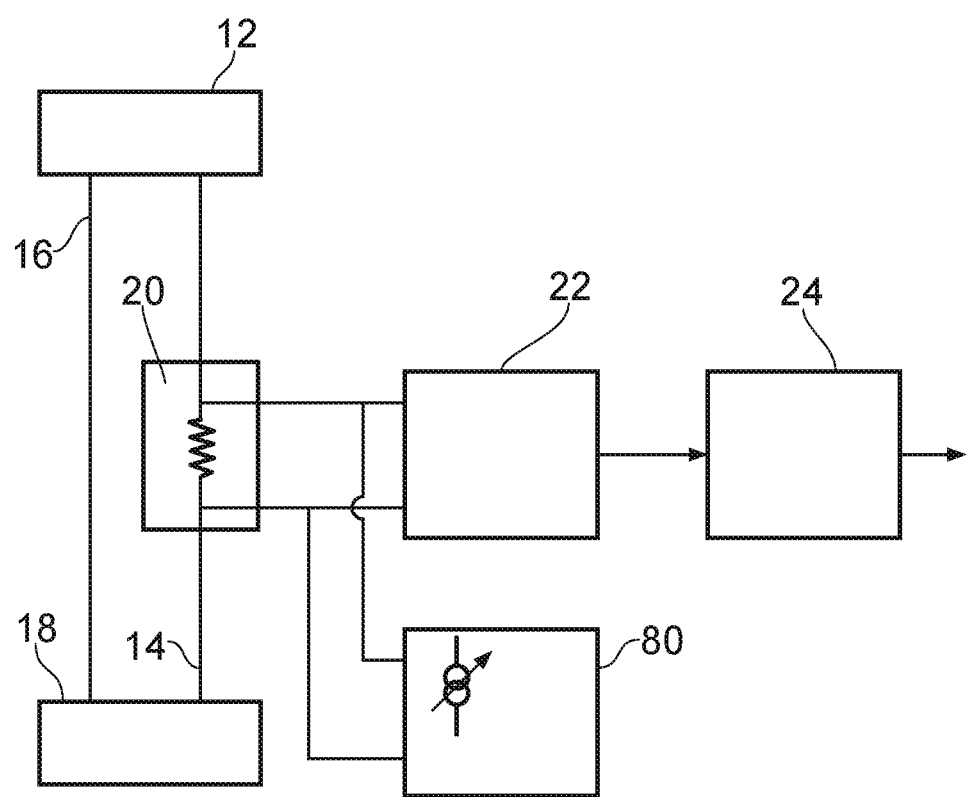
FIG. 7 schematically illustrates a current measurement apparatus.

A suitable example arrangement is shown in FIG. 7. Here the shunt resistor 20 is, as shown before with respect to FIG. 2, connected in the current flow path of the live conductor between the source 12 and the load 18. The voltage across the shunt resistor 20 is measured by a voltage measuring circuit 22, for example in the form of an analog to digital convertor. In order to determine an estimate of the transfer function of the current measurement path a current measurement circuit 80 is provided which comprises a controllable current source/current sink which can controllably pass an additional current through the resistor 20. The resistance of the resistor 20 is very low, and hence is susceptible to change as a result of impurities at its contacts, hence the value may be quite uncertain. That additional current, which value is well known and controlled, gives rise to a corresponding voltage change across the resistor 20 which can be measured by the analog to digital convertor 22 and then this information can be used to determine an estimate of the transfer function of the current measurement path. In the arrangement shown in FIG. 7, the circuit 80 injects current at one end of the resistor and removes it at the other. Thus, in this arrangement, the current flow may be bidirectional. However, in other arrangements the connection might only be made to the load end of the resistor 20, such that current is drawn through the resistor.

A controllable current source 80 may for example be operated in a substantially binary manner such that it is either on or off. However, as contemplated in WO2013/038176, the current source may also be modulated to a plurality of current values for greater resolution, see for example FIG. 17c thereof.

Thus, the monitor module 110 may estimate the transfer functions for any one or more of the $I_A$, $I_B$ and/or $V_A$ measurement sensors. It will be appreciated that whilst particular techniques for estimating the transfer functions are described above, the monitor module 110 may be configured to determine the transfer functions in any suitable way.

The monitor module 110 may also be configured to determine a certainty value (Cert) for each CC. The Cert is indicative of certainty (or confidence) that the CC is correct (or indicative of uncertainty, being the obverse of certainty/confidence). Cert may take any suitable form, for example a percentage value, or a decimal value, etc. In one particular example, Cert may take the form of a percentage value, wherein lower percentage values indicate greater certainty. For example, a Cert of 1% would indicate that the determined CC is accurate to within +/−1%, and Cert of 50% would indicate that the determined CC is accurate to within +/−50%, etc. In this way, Cert may be thought of as defining an error bar for its corresponding CC.

Ways to determine Certs for CCs are described in PCT/US2016/068089, to which the reader is referred for enabling disclosures as to how to determine Certs for CCs, and which is incorporated in its entirety herein by reference. However, for ease of reference, examples of that patent application are included herein.

As explained in PCT/US2016/068089, the perturbations applied in the voltage measurement circuit and in the current measurement arrangement described earlier with respect of FIGS. 2-7 are generally provided at a known frequency, and at a frequency which is selected on the assumption that it is not a harmonic of the fundamental supply or load frequency. However the performance of the load 18 is not known and it may be electrically noisy. For example the load 18 might be a large computer load having a switch mode power supply which may be noisy, may include fluorescent lighting, or may be an ensemble of devices connected to the load. As a result, the frequency spectrum of the current waveforms, and indeed the voltage waveform due to noise propagating back up the conductors 14 and 16 towards the power source 12, may interfere with the determination of the transfer functions. Indeed, the harmonics from the load 18 represent noise at the perturbation frequency which may cause the estimate of the transfer function to become variable.

The variation in successive estimates of the transfer function and/or noise compared to the perturbation signal can be used to determine a level of confidence (Cert) in the estimated transfer function. The variation in a predetermined number of transfer function estimates may be looked at and a value for Cert determined by analysing the scatter between those values, using statistical tools such as T-tests or standard deviations.

Figure 8:
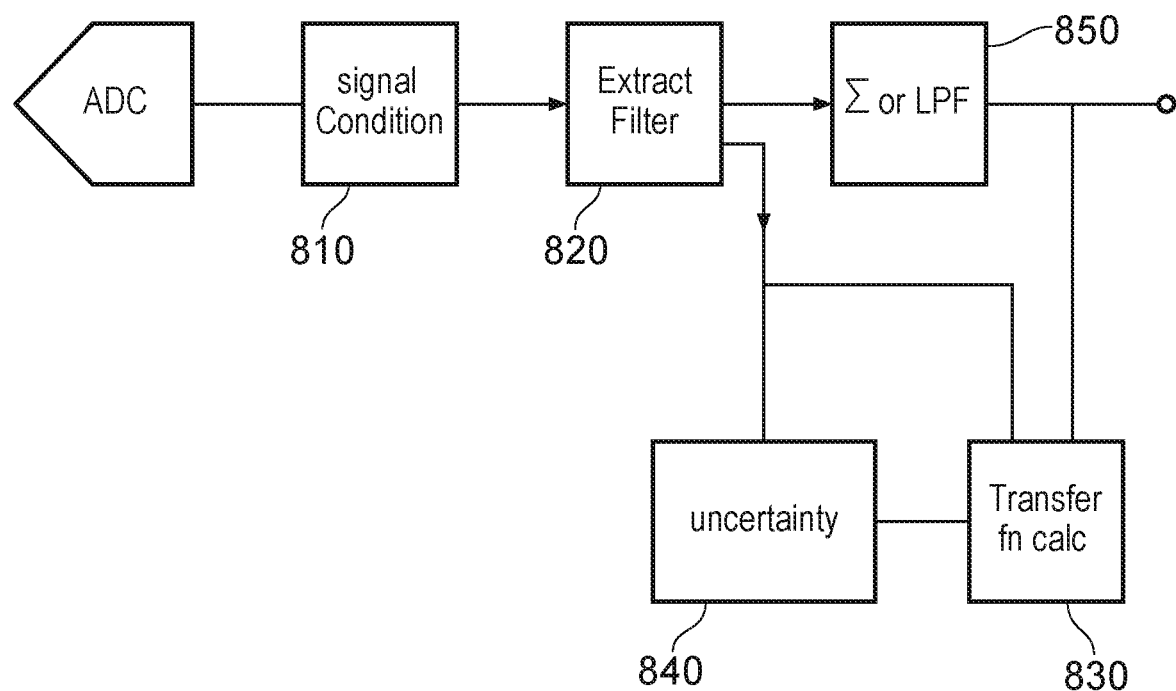
FIG. 8 shows a block diagram of components in a channel of a transfer apparatus.

FIG. 8 schematically illustrates functional blocks that may be included in the monitor module 110 for determining Cert. The apparatus is responsive to the output of an ADC such as the ADC 68 which may be included in block 26 of FIG. 2, or the ADC associated with the current measurement channel as represented by block 22 of FIG. 2. The output of the ADC may require signal conditioning, for example scaling, windowing or equalizing in order to accommodate for variations in ADC performance, and/or align data for use in subsequent processing, especially where the data may be collected amongst several channels each similar or identical to that shown in FIG. 8, as might be the case in a multiphase system. The signal conditioning can be performed in the digital domain by block 810. The conditioning signal from block 810 may then be provided to an extraction circuit 820 which serves to extract the perturbation signal provided by the measurement apparatus. In this context, extraction could be regarded as synonymous with band pass filtering the input signal around the perturbation signal in order to provide a measurement of the perturbation signal to a transfer function calculator 830 and an uncertainty calculator 840. The uncertainty calculator may work directly with the perturbation signal from the extractor 820 if the transfer function can be assumed or it may additionally or alternatively work with the output from the transfer function calculator 830.

It may be useful for the monitor module 110 to determine and report on the CC and Cert for the measurement sensors 120 on a regular basis (in the order of seconds, for example on a second-by-second basis) so that the accuracy of measurement sensors 120 may be reliably monitored. However, this would result in a large volume of data to be processed and interpreted in order to monitor the accuracy of the measurement sensors 120. It has been recognised that such processing and interpreting may be most effectively carried out by the network entity 160 (for example, a cloud based entity, such as one associated with the utility provider), since the network entity 160 may be able to harness significantly greater computing powers than the utility meter system 100. However, the bandwidth of communications between the communications module 150 and the network entity 160 may be limited, which may make it difficult to transfer a large volume of CC and Cert values to the network entity 160 for analysis.

Furthermore, the monitor module 110 may be configured to be able to determine a CC and Cert for only one measurement sensor at any one time. Where the measurement sensors 120 comprise two or more different measurement sensors (for example, for measuring two or more of $I_A$, $I_B$ and/or $V_A$), it may be helpful to monitor the CC and Cert in relation to each of the two or more measurement sensors in order to reliably monitor accuracy. Consequently, some control of the operation of the monitor module 110 to determine CCs and Certs may be required. However, controlling the operation of the monitor module 110 may require changing at least some of the settings associated with the monitor module 110. Standards relating to 'Legal Metrology' (such as the International Organisation for Legal Metrology (OIML) Standard R 46) mean that the settings associated with the monitor module 110 should be carefully controlled, so that the CCs and Certs are determined by the monitor module 110 consistently and reliably. Thus, whilst it may be helpful for the network entity 160 to interface with the utility consumption meter 100 to obtain CCs and Certs from the monitor module 110 for further analysis, such interaction may carry 'Legal Metrology' risks (for example, exposing the utility meter system 100 to the possibility of changes to the monitor module 110 settings being applied by the network entity 160, which might contravene 'Legal Metrology' standards).

The inventors have recognised that by implementing a manager on the MCU 130 of the utility consumption meter 100, the manager may be configured to control the operation of the monitor module 110 and receive determined CCs and Certs from the monitor module 110 at one end, and send relevant data to the network entity 160 at the other end. The manager can be architected so that its controlling functionality is separated from its network functions, so that it may effectively buffer the network entity 160 from any monitor module 110 settings changes. Thus, 'Legal Metrology' standards may be maintained, whilst still enabling CC and Cert related data to be communicated to the network entity 160.

An overview of the operation of such a manager is initially set out below, before further more specific details of the manager are provided.

The Manager

Figure 9:
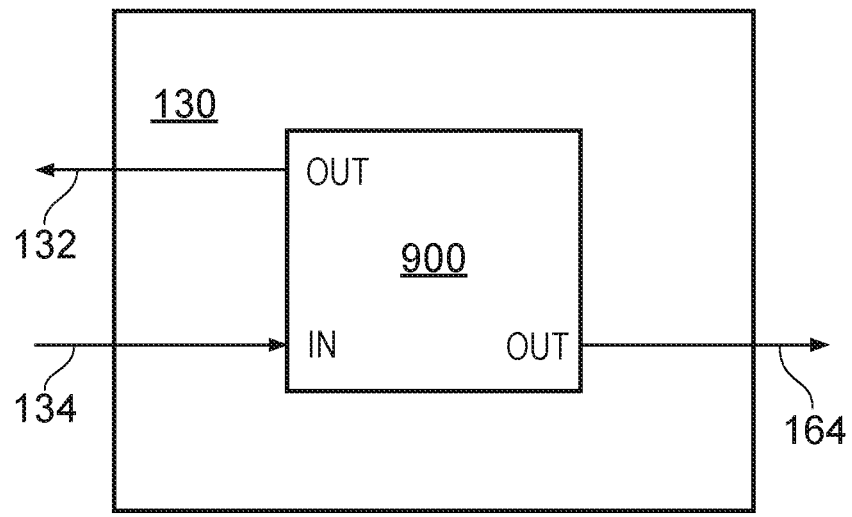
FIG. 9 shows a block diagram of a manager apparatus in accordance with an aspect of the present disclosure.

FIG. 9 schematically illustrates an example of the manager 900 implemented within the MCU 130. The manager 900 may preferably be implemented as firmware running on the MCU 130, although it will be appreciated that it may be implemented in any other suitable way, for example as a different type of software, or as hardware.

The manager 900 is configured to control the operation of the monitor module 110, obtain results from the monitor module 110 (for example, determined CCs and Certs) and generate reports based at least in part on the obtained results, which may be communicated to the network entity 160 via the communications module 150.

Output 132 in FIG. 9 is representative of control instructions from the manager 900 to the monitor module 110. The control instructions may comprise at least one of a monitor enable/disable instruction (for enabling or disabling the operation of the monitor module 110), a channel select instruction (for selecting a particular measurement sensor in the measurement sensors 120 for which the monitor module should determine a CC and Cert) and/or a power mode instruction (for controlling the power mode to be used in the determination of the CC and Cert). The manager 900 may be configured to issue the control instructions to the monitor module 110 in any suitable way, for example by changing register values in the monitor module 110, as explained in more detail later.

The monitor module 110 determines an estimate of the transfer function (CC) of a measurement sensor over an individual run length of time (i.e., over a period of time). This is explained in more detail later. However, it may be noted now that by using the channel select control and enable/disable control (output 132), the manager 900 may exercise control over the operating state of the monitor module 110, in particular when the monitor module 110 starts an individual run for determining a CC for a particular measurement sensor (for example, by virtue of the timing of issuing the 'enable' and 'channel select' instruction to the monitor module 110) and the length of time of the individual run (for example, by virtue of the length of time for which the manager 900 applies 'enable' and a particular 'channel select' instruction to the monitor module 110).

Input 134 in FIG. 9 is representative of the monitor results from the monitor module 110. The monitor results comprise a determined CC and Cert for the channel that was earlier selected by the manager 900. The manager 900 may obtain the monitor results from the monitor module 110 in any suitable way, for example by receiving them for the monitor module 110, by retrieving them from a location in memory 140 to which the monitor module 110 has written them, by retrieving them from the monitor module 110 (for example, from a register in the monitor module 110), etc.

Whilst the present disclosure generally describes the monitor module 110 always determining a Cert to correspond with a determined CC and communicating the determined Cert and CC to the manager 900, in an alternative implementation the monitor module 110 may not determine a Cert, such that the monitor results communicated to the manager 900 comprise a CC without a corresponding Cert (although it will be appreciated from details given later in the disclosure that, preferably, a corresponding Cert is determined for each determined CC and communicated to the manager 900 along with the CC in the monitor results).

Output 164 in FIG. 9 is representative of a report generated by the manager 900 being output from the manager 900 for communication to the network entity 160 (for example, via the communications module 150). The report is determined by the manager 900 based at least in part on one or more monitor results obtained by the manager 900 from the monitor module 110. For example, it may comprise one or more of the CCs (and optionally corresponding Certs), or more preferably (as explained later) it may be derived at least in part from one or more of the CCs (and optionally the corresponding Certs). The report may be output from the manager 900 to the network entity 160 in any suitable way, for example by communicating it via the communications module 150, by writing the report to one or more read-only registers that are accessible to the network entity 160 via the communications module 150, etc, as explained in more detail later.

Figure 10:
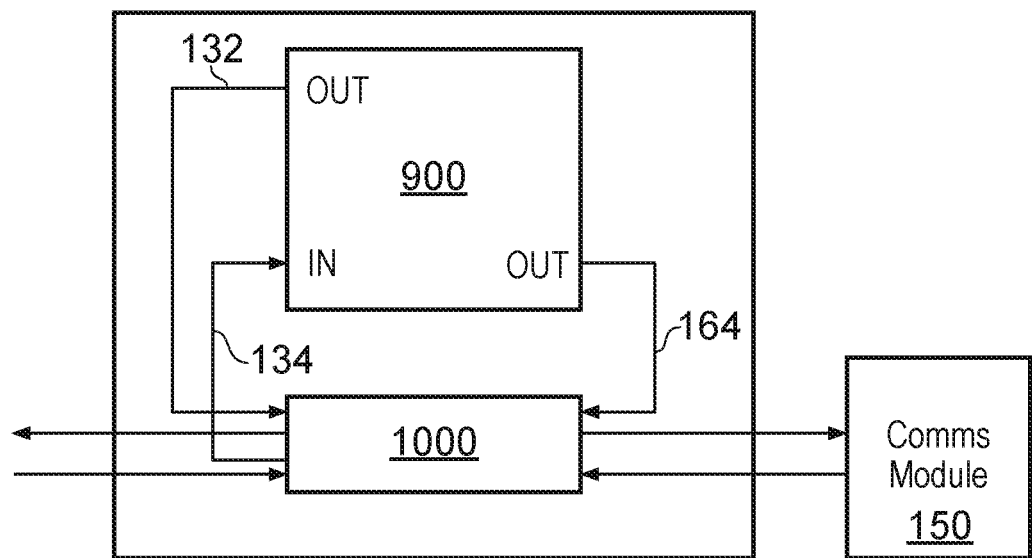
FIG. 10 shows a block diagram representing further details of the architecture of the manager apparatus of FIG. 9.

FIG. 10 schematically illustrates further details of an implementation of the manager 900, specifically representing its interaction with software (user code) 1000 on the MCU 130. In this example, the manager 900 is implemented in firmware and is configured to interface with the user code 1000. The user code 1000 is software on the MCU 130 that may be configured to perform various different utility meter functions, such as reading utility consumption measurements from the measurement frontend, driving a local display on the utility consumption meter 100, enabling battery backup systems, etc. However, only aspects of the user code 1000 that interact with the manager 900 shall be described in detail below.

The utility meter system 100 may be configured such that during operation, the manager 900 has exclusive responsibility for controlling the operation of the monitor module 110, through use of the control instructions 132. In this way, the manager 900 can be configured to adhere to 'Legal Metrology' standards and control of the monitor module 110 by any other entities (for example, by the network entity 160) may be prevented, thereby maintaining 'Legal Metrology' standards.

To this end, the user code 1000 may be configured to call on the manager 900 to request the control instructions 132. The manager 900 may then determine the control instructions 132, as explained in more detail below in the 'controller 1110' section, and return the control instructions 132 to the user code 1000 so that the user code 1000 can execute the control instructions 132 (for example, using an SPI bus to the monitor module 110). The control instructions 132 may be executed in any suitable way, for example by writing them to a suitable register of the monitor module 110. Thus, the manager 900 may effectively operate as an API to the user code 1000 and the user code 1000 may effectively operate as a conduit through which the control instructions 132 can be executed.

The user code 1000 may be configured to obtain monitor results 134 from the monitor module 110 by reading them from a register to which the monitor module 110 has written them. For example, the user code 900 may perform regular SPI reads of a monitor module register (for example, a register or subset of registers that the user code 900 is configured always to read, or a register or subset of registers that the manager 900 has told the user code 1000 to read). The user code 1000 may then pass any retrieved monitor results 134 on to the manager 900, for example as part of a call to the manager 900 to request the next set of control instructions 132, or at any other suitable time.

This process of reading a monitor result 134 from the monitor module 110, passing the monitor result on to the manager 900, calling on the manager 900 to request control instructions 132 and writing the control instructions 132 to the monitor module 110 may be repeated regularly, for example ever second, or every 2 seconds, or every 5 seconds, etc.

In order to maintain Legal Metrology requirements, at least the part of the user code 1000 configured to perform the above described functionality may be implemented in a way in which it cannot be altered or modified by any external entity (for example, it may be implemented as firmware in read-only memory, which may be part of the MCU 130, or part of memory 140, or part of some other memory module or entity in the utility meter system 100), such that the way in which it interacts with the monitor module 110 and the manager 900 cannot be altered or modified in any way. Furthermore, the manager 900 may also be implemented in a way in which it cannot be altered or modified by any external entity, (for example it may be implemented as firmware in read-only memory, which may be part of the MCU 130, or part of memory 140, or part of some other memory module or entity in the utility meter system 100).

The user code 1000 may obtain the report 164 from the manager 900 in any suitable way, for example by reading a register on the manager 900, or by calling on the manager to generate the report 164 in response to which the manager 900 generates and returns the report (for example, the user code 1000 may perform that at regular, or periodic intervals), etc. The user code 1000 may then output the report 164 to the communications module 150 for communication to the network entity 160. Alternatively, the manager 900 may output the report 164 to the network entity 160 via the communications module 150 without the use of user code 1000 (for example, by the network entity 160 reading the report from a read-only register on the manager 900, or as part of a push or pull communication with the network entity 160, etc). In any case, it can be seen that the network entity 160 is not given access to any part of the operation of the manager 900 or monitor module 110, and thus 'Legal Metrology' is maintained.

It will be appreciated that this is merely one non-limiting example of how the manager 900 may be configured in order to maintain 'Legal Metrology' standards and that it may alternatively be configured in any other suitable way. For example, it may be configured to be able to read and write to the monitor module 110 without the need for any user code 1000 and/or it may be implemented in a different part of the utility meter system 100, for example within the monitor module 110 itself. Furthermore, whilst the above describes the manager 900 obtaining the monitor results 134 by the user code 1000 reading them from a register on the monitor module 110, they may alternatively be obtained in any suitable way, for example by the manager 900 itself reading them from a register on the monitor module 110, or the manager 900 receiving them from the monitor module 110, for example in a push or pull communication process, etc. Likewise, the control instructions 134 may be applied to the monitor module 110 in any suitable way (not just through the use of a write register on the monitor module 110) by the user code 1000, or the manager 900, or by any other means.

As will be explained in more detail later, the manager 900 may be configured to use one or more static setting to determine the control instructions 132 and/or to generate the report 164. Static settings are settings that are made during initial configuration of the manager 900, for example during factory configuration. As will become apparent later, the static settings may relate to the way in which particular operators of the utility meter system 100 (for example, a utility provider) would like the manager 900 to operate and/or other invariant settings relating to the utility meter system (for example, a benchmark transfer function which is the transfer function of one of the measurement sensors 120 at the time of manufacture and configuration of the manager 900). The static settings are 'static' in that they are invariant and cannot be altered after the initial manufacture and configuration of the manager 900. Since a number of the static settings relate to the way in which the manager 900 controls the monitor module 110 and/or interprets monitor result 134 to generate the report 164, by making those settings static, they cannot be modified or changed during operation of the manager 900 and monitor module 110. Thus, 'Legal Metrology' requirements may again be satisfied. The static settings may be stored in any suitable way in memory, for example in read-only memory in the MCU 130, or memory 140, or elsewhere.

Figure 11:
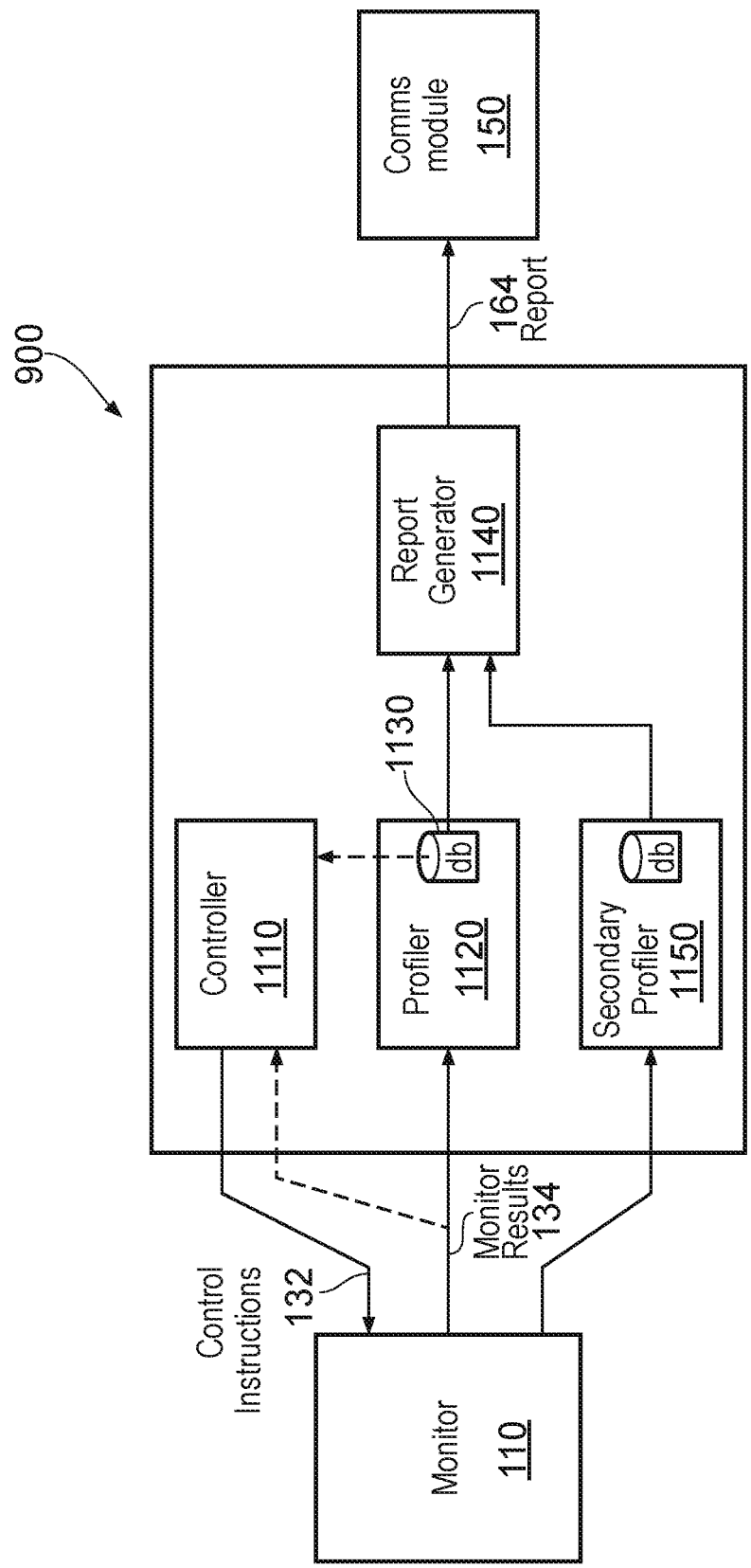
FIG. 11 shows a block diagram of example modules of the manager apparatus of FIG. 9.

FIG. 11 schematically illustrates an example implementation of the manager 900. The manager 900 comprises a controller 1110, a profiler 1120 and a report generator 1140. The profiler 1120 is represented as comprising a database 1130, although it will be appreciated that the database 1130 may alternatively be located elsewhere on the manager 900, or elsewhere in the MCU 130 or utility meter system 100 (for example, as part of memory 140), and be configured such that the profiler 1120 can write data to the database 1130 and the report generator 1140 can read data from the database 1130. The manager 900 also optionally comprises a secondary profiler 1150.

Controller 1110

The controller 1110 is responsible for controlling the operation of the monitor module 110. It may determine and issue the control instructions 132 to start and stop the monitor module 110, select the channel of operation of the monitor module 110 and set the power mode of operation of the monitor module 110. The manager 900 may be configured so that the controller 1110 is the only functional block within the manager 900 that can control the operation of the monitor module 110 (for example, the only functional block that can write to registers on the monitor module 110).

The monitor module 110 may have one or more channels on which it can operate. For example, a first channel may be to monitor the measurement sensor in the measurement sensors 120 responsible for measuring live current $I_A$ in order to determine monitor results (CC and Cert) for that measurement sensor. That first channel shall be referred to from hereon as the $I_A$ channel. A second channel may be to monitor the measurement sensor in the measurement sensors 120 responsible for measuring neutral current $I_B$ in order to determine monitor results (CC and Cert) for that measurement sensor. That second channel shall be referred to from hereon as the $I_B$ channel. A third channel may be to monitor the measurement sensor in the measurement sensors 120 responsible for measuring voltage $V_A$ in order to determine monitor results (CC and Cert) for that measurement sensor. That third channel shall be referred to from hereon as the $V_A$ channel. The monitor module 110 may be configured to operate on only one of these channels at any one time, so the controller 1110 is configured to determine which channel (if any) the monitor module 110 should operate on at any particular time, and for how long it should operate on that channel. Whilst in the explanation below the monitor module 110 is always described as having three available channels ($I_A$, $I_B$ and $V_A$), it will be appreciated that the monitor module 110 may alternatively have any number of channels on which it can operate (i.e. one or more channels), such as one channel, two channels, four channels, etc.

Whilst the monitor module 110 may be able to monitor a plurality of different channels, it may be that only some of those channels are of interest to the manager 900. For example, the static monitor settings may comprise a channel of interest setting that indicates one or more channels of interest, which may be all of the channels that the monitor module 110 can monitor, or only some of the channels that the monitor module 110 can monitor. In the following description, we shall assume that the $I_A$ channel, $I_B$ channel and $V_A$ channel are all channels of interest. However, it will be appreciated that an alternative configuration of static monitor settings, only one or more of these channels may be channels of interest.

In the example where the $I_A$ channel, $I_B$ channel and $V_A$ channel are all channels of interest, the controller 1110 first selects an operating state for the monitor module 110 from the following plurality of monitor module operating states:

a) do not monitor any channel (i.e., do not monitor any measurement sensor in the measurement sensors 120);

b) monitor at least the $I_A$ channel (i.e., monitor at least the measurement sensor of the measurement sensors 120 responsible for measuring $I_A$) to determine a monitor result for that sensor;

c) monitor at least the $I_B$ channel (i.e., monitor at least the measurement sensor of the measurement sensors 120 responsible for measuring $I_B$) to determine a monitor result for that sensor;

d) monitor at least the $V_A$ channel (i.e., monitor at least the measurement sensor of the measurement sensors 120 responsible for measuring $V_A$) to determine a monitor result for that sensor;

and then perform a control action to implement the selected operating state. Further details of the process for selecting the operating state and performing a control action are given in the later description of FIGS. 14 and 15.

The particular implementation of the monitor module 110 described throughout the present disclosure is such that only one of the channels $I_A$, $I_B$ or $V_A$ may be monitored by the monitor module 110 at any one time, such that the controller 1110 may select only one channel at any one time. However, in an alternative configuration, the monitor module 110 may monitor two or more channels at any one time, hence why the operating states b) to d) identified above refer to monitoring 'at least' one particular channel. For example, if the controller 1110 were to select operating state b), it will perform a control action to instruct the monitor module 110 to monitor channel $I_B$ and optionally one or more further channels (if the monitor module 110 is configured to allow this and if the controller 1110 determines that one or more further channels should also be monitored at that time).

Figure 12:
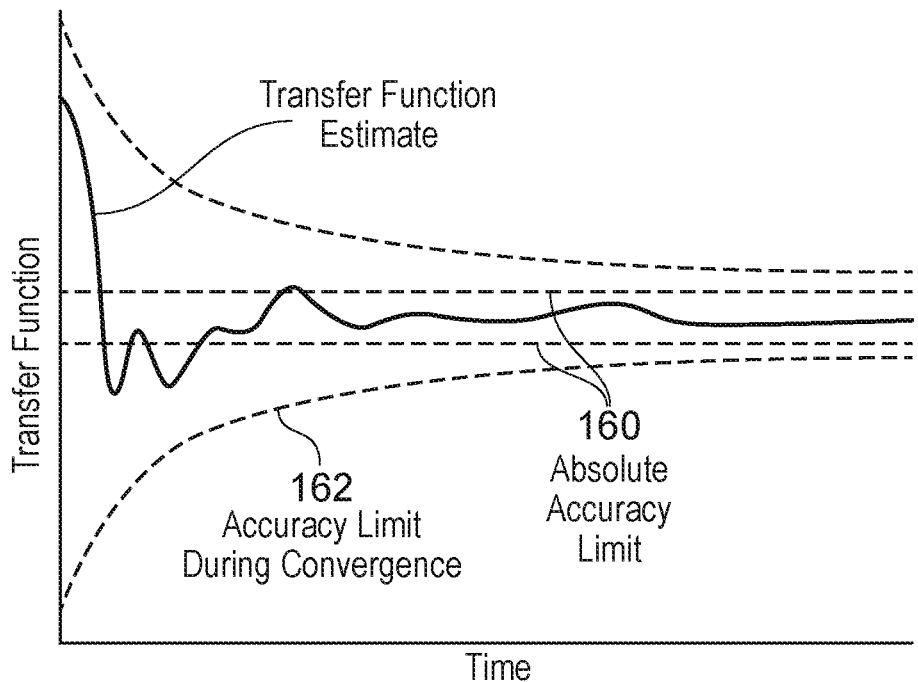
FIG. 12 shows an example evolution of the estimate of a transfer function with respect to time.
Figure 13:
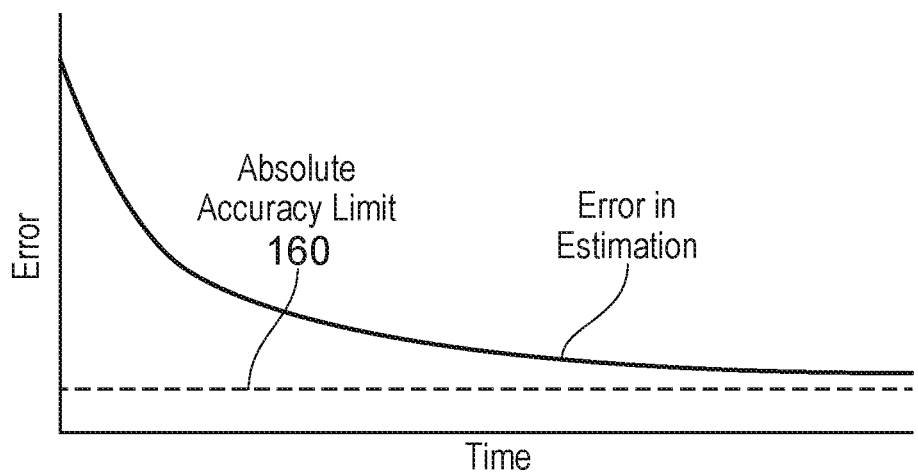
FIG. 13 shows an example of the evolution of certainty in the estimate of a transfer function with respect to time.

The controller 1110 should balance how much time is given to each operating state in order to achieve particular objectives for the monitor results, such as those set by the static monitor settings. This may be particularly important where the monitor module 110 can only monitor one channel at a time. Typically, the more time that is given to monitoring a channel, the more accurate the determined CC for that channel may be. This is explained in detail in PCT/US2016/068089 and may be appreciated from FIGS. 12 and 13.

However, if each channel is monitored for the same amount of time, they may not achieve the same level of accuracy, since the amount of noise on each channel may differ. For example, if there is more noise on the $V_A$ channel than the $I_A$ channel, in order to achieve the same level of accuracy for the CCs determined for $V_A$ and $I_A$, the $V_A$ channel may need to be monitored for longer. Furthermore, monitoring channels $I_A$ and $I_B$ may cause additional power to be drawn from the source 12, which should be paid for by the operator of the utility meter system 100 (for example, the utility supplier), rather than the consumer of the utility. Therefore, it may be desirable to balance the requirements of accurate CC determination against requirements to minimise power consumption.

Figure 14:
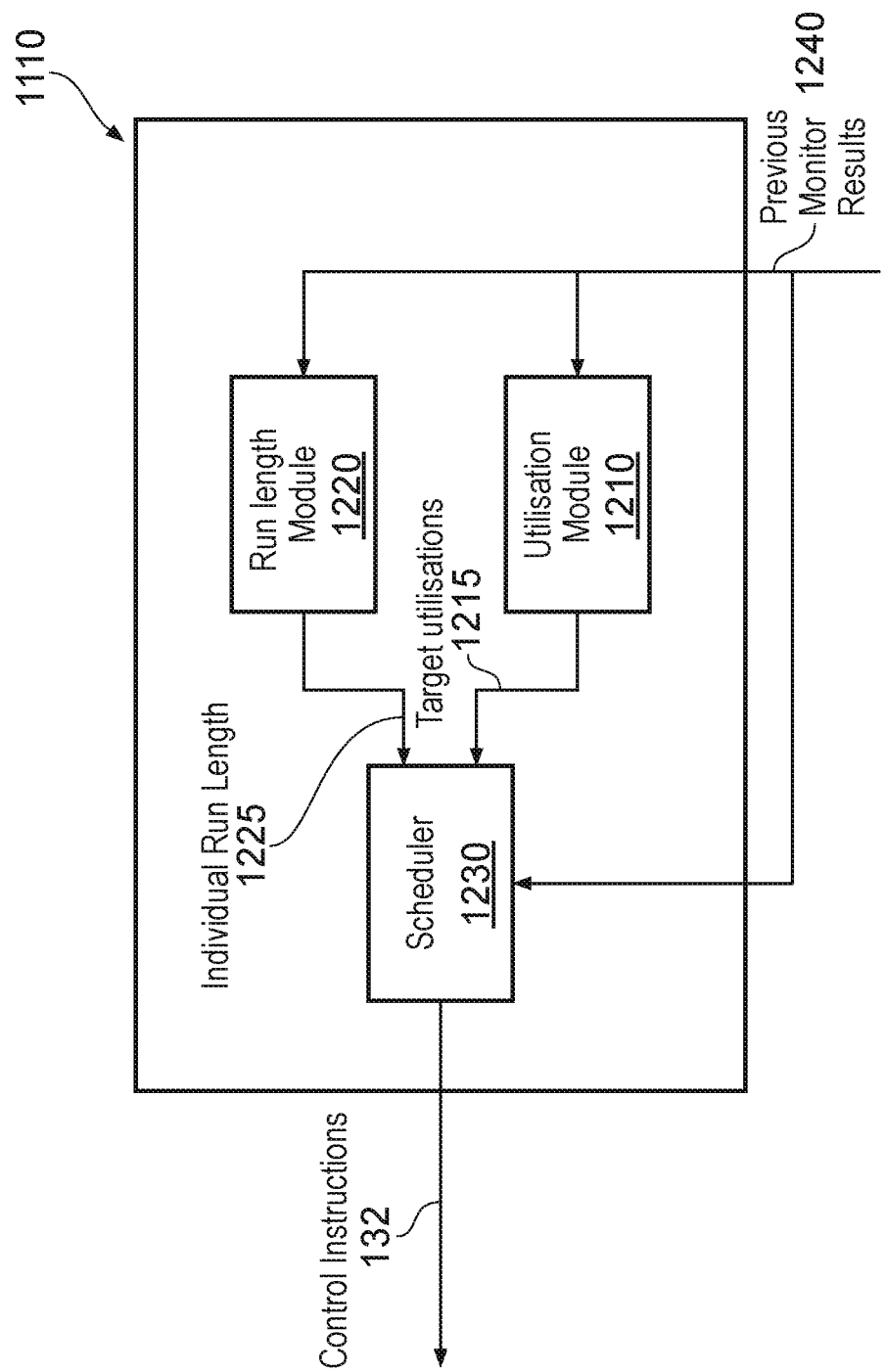
FIG. 14 shows a block diagram of example sub-modules of a controller module of the manager apparatus of FIG. 9.

FIG. 14 schematically illustrates an example implementation of the controller 1110. The controller 1110 comprises a utilisation module 1210, a run length module 1220 and a scheduler 1230.

Figure 15:
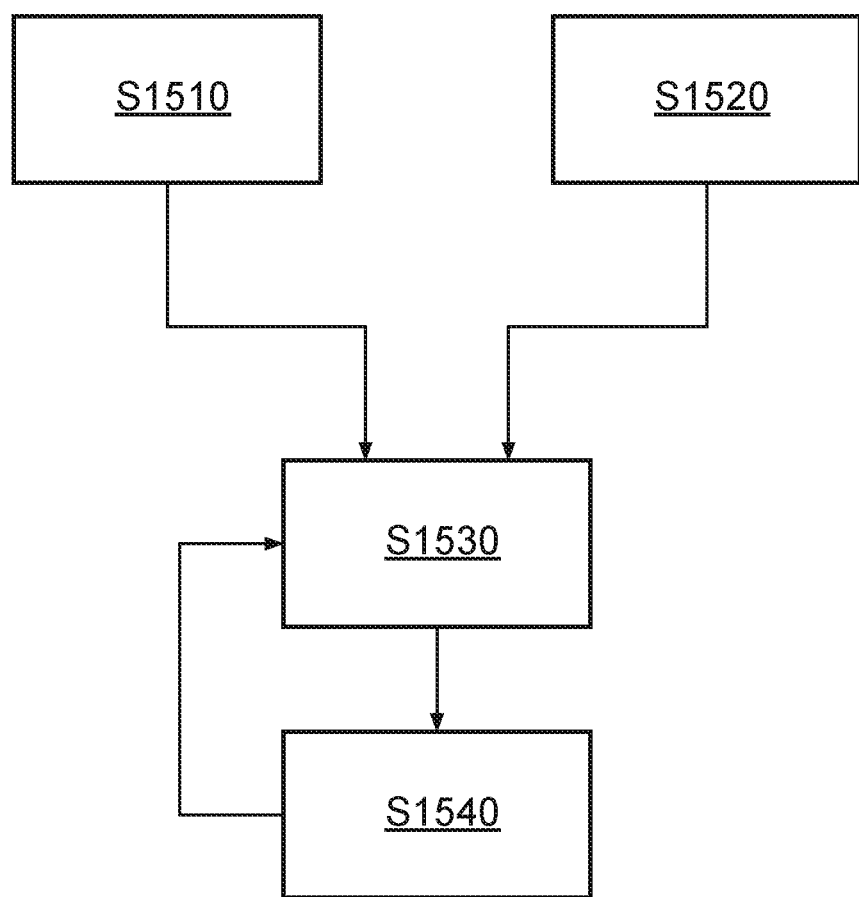
FIG. 15 shows an example flow diagram of representing the operation of the controller module of FIG. 14.

FIG. 15 shows an example flow diagram representing the operation of the controller 1110.

In Step S1510, the utilisation module 1210 determines a utilisation target (U_RATIO) 1215 for each of the channels of interest $I_A$, $I_B$ and $V_A$. This process is described in more detail below under the 'utilisation module 1210' heading.

In Step S1520, the run length module 1220 determines an individual run length 1225 for each of the channels of interest $I_A$, $I_B$ and $V_A$. This process is described in more detail below under the 'run length module 1220' heading.

In Step 1530, the scheduler 1230 uses the U_RATIOs 1215 and individual run lengths 1225 to select the operating state for the monitor module 110 and then in Step S1540 perform a control action to implement the selected operating state for a period of time (which is referred to below as an individual run length of time). At the completion of the individual run length of time, the process returns to Step S1530 where the scheduler 1230 uses the current U_RATIOs 1215 and individual run lengths 1225 to select the operating state for the monitor module 110 for the next individual run length of time and then perform a control action to implement the selected operating state for the next individual run length of time. This process is described in more detail below under the 'Scheduler 1230' heading.

Steps S1510 and S1520 may be regularly repeated in order to update, alter or modify the U_RATIOs 1215 and individual run lengths 1225 based on previous monitor results 1240 from the monitor module 110. In Step S1530, the scheduler 1230 may therefore use the most recently determined U_RATIOs 1215 and individual run lengths 1225 and in this way the previous monitor results 1240 may be used as feedback to change the behaviour of the controller 1110.

Utilisation Module 1210

A U_RATIO for a channel is indicative of a target total proportion of a monitoring time window to be spent by the monitor module 110 determining a monitor result for that channel. The monitoring time window may be any amount of time which may be fixed by the controller 1110, or altered by the controller 1110. By way of one non-limiting example, if the monitoring time window is one hour and the U_RATIO for channel $I_A$ is 0.25 or 25%, the controller 1110 should try to control the operation of the monitor module 110 so that channel $I_A$ is monitored for a total of 15 minutes in that hour long monitoring time window. Thus, it can be seen that the U_RATIO for each channel should be less than or equal to 1 or 100% (a U_RATIO of 1 or 100% being indicative of the monitor module 110 monitoring that channel for the entirety of the monitoring time window) and that the sum of the U_RATIOs for all channels of interest should be less than or equal to 1 or 100% if the monitor module 110 is configured to be able to monitor only one channel at any one time. If the sum of the U_RATIOs is less than 1 or 100%, this is indicative that the controller 1110 should aim to control the monitor module 110 not to monitor any channel (i.e. operation state (a) described above) for some period of time during the monitoring time window. This may have some benefits in reducing the power consumption of the monitor module 110, as explained later.

On initial start-up of the manager 900, there will be no previous monitor results 1240 available to the utilisation module 1210, so the U_RATIOs may be determined based on static utilisation settings, which are particular settings within the static monitor settings. The static utilisation settings comprise a power consumption setting indicative of a desired power consumption for the monitor module 110 and/or a channel priority setting indicative of a desired level of accuracy for each channel of interest, for example a target minimum level of accuracy to be achieved for each channel of interest.

The channel priority setting may be configured to be indicative of a desired level of accuracy. For example, it may specify particular minimum levels of certainty for CCs determined on each channel (for example, it may specify that the Cert for a particular channel should be 1% or less, which would mean that the CC determined for that channel should be accurate to within +/−1%, etc. It will be appreciated that in the particular example given in this disclosure a larger value of Cert indicates lower accuracy, so a minimum target level of certainty may be thought of as a target maximum Cert value). Alternatively, the channel priority setting may be indicative of target minimum levels of accuracy to be achieved for each channel merely by specifying a relative importance of certainty for each channel, for example indicating that the accuracy required for one particular channel is less than the accuracy required for the other channels (for example, indicating that the accuracy required for the channel $I_A$ is half that required for $V_A$, or a quarter of that required for $V_A$, etc). Thus, the target minimum levels of accuracy may be target relative levels of accuracy. In this way, the channel priority setting may seek to achieve a balance between the relative performance of the channels.

In general, in one non-limiting example of the monitor module 110, doubling the amount of time for which a channel is monitored may improve the level of certainty by a factor of $\sqrt{2}$. For example, if the monitor module 110 monitors a channel for a particular period of time and at the end of that time returns a CC with a corresponding Cert value of 1.25%, if it had instead monitored the channel for twice as long the Cert value would have been about 0.88%.

Thus, for this particular configuration of monitor module 110, in order to double the accuracy of the determination of CC for a channel, the monitor module 110 should be instructed to monitor the channel for four times as long. It will be appreciated that this is only one particular example configuration of monitor module 110 and different configurations may have a different relationship between level of accuracy and amount of time monitoring a channel. However, typically, monitoring a channel for longer should usually improve the accuracy (i.e., result in a better Cert) of the CC, assuming the noise levels on the channel remain essentially constant.

Thus, it will be appreciated that initially at least, if the channel priority setting indicates that one or more channels have a higher priority (i.e., a higher level of accuracy is desired) than the other channel(s), the U_RATIO should be set to be higher for those one of more channels.

The power consumption setting may take any suitable form that assists the utilisation module 1210 to determine the U_RATIOs. One particular, none limiting example, is given in the table below.

| Power consumption setting | Impact on U_RATIOs |
|---|---|
| 1 | No impact on U_RATIOs |
| 2 | $I_A$ and $I_B$ combined U_RATIO < 25% |
| 3 | $I_A$ and $I_B$ combined U_RATIO < 10% |
| 4 | $I_A$ and $I_B$ combined U_RATIO < 5% |
| 5 | $I_A$ and $I_B$ combined U_RATIO < 1% |
| 6 | $I_A$ and $I_B$ combined U_RATIO < 1% and $I_A$ and $I_B$ should be operated in Low Power mode |

Thus, in this particular example, if the power consumption setting is "1", then power consumption of the monitor module 110 is not a concern and should not affect the determined U_RATIOs in any way (for example, the U_RATIOs should be determined based on the other factors, such as the channel priority setting, without any concern for power consumption). If the power consumption setting is "2", "3", "4" or "5", the combined U_RATIOs for the $I_A$ and $I_B$ channels should stay within the limits identified. If the consumption setting is "6", the combined U_RATIOs for the $I_A$ and $I_B$ channels should be less than 1% and the power mode instruction in the control instructions 132 should be set to "low power mode" rather than "normal power mode".

After one or more monitor results 134 have been returned by the monitor module 110, the utilisation module 120 may obtain the previous monitor results 1240 (either directly from the monitor module 110, as shown in one dotted line in FIG. 11, or by retrieving them from the profiler database 1130, as shown in the other dotted line in FIG. 11). These are then referred to below as "previously determined monitor results 1240". The utilisation module 120 may compare the Cert value(s) in the one or more previously determined monitor results 1240 against the channel priority setting and if necessary adjust the U_RATIOs to give more time to channels whose Cert value(s) is failing to achieve a target minimum level of accuracy required by the channel priority setting (whilst still keeping the U_RATIOs within any limits set by the power consumption setting). The utilisation module 120 may be configured in this regard to consider a particular number of the most recent previously determined monitor results 1240 for each channel (for example, the most recent three previously determined monitor results for channel $I_A$, the most recent three previously determined monitor results for channel $I_B$ and the most recent three previously determined monitor results for channel $V_A$), or the previously determined monitor results 1240 that were determined within a particular period of time (for example, the monitor results 134 determined within the preceding 20 minutes, or the preceding 30 minutes, or the preceding hour, etc). When two or more previously determined monitor results 1240 for a particular channel are considered by the utilisation module 1210, the utilisation module 1210 may compare the accuracy of those results across the entire monitoring time window (which, as explained earlier, is likely to be indicative of a higher degree of accuracy than accuracy for each individual run on a channel within the monitoring time window) against the target minimum level of accuracy and adjust the U_RATIOs based on that comparison.

In this way, the utilisation module 1210 may be able to recognise when target minimum levels of accuracy are not being achieved (for example, because there is a lot of noise on a particular channel) and adjust the behaviour of the controller 1110 to try to achieve the target minimum levels in future monitor results.

Optionally, the static utilisation settings may additionally or alternatively comprise a maximum accuracy level setting, indicative of a target maximum level of accuracy for CCs on one or more channels. For example, the target maximum level of accuracy may specify a particular level of certainty that should not be bettered on a particular channel (for example, the Cert value should not be below a particular value, such as 0.5%, or 1%, etc), or may specify a relative target maximum level of accuracy (for example, indicating a maximum amount by which the accuracy on one channel may better the accuracy on another channel) so as to achieve a balance between the relative performance of the channels.

The utilisation module 1210 may compare the one or more previously determined monitor results 1240 against the target maximum level of accuracy in an analogous way to that described above in respect of the target minimum level of accuracy. For any channels that have a Cert (or average Cert) that betters the target maximum level of accuracy (i.e., are more accurate than the maximum level of accuracy), the U_RATIO for those channels may be reduced. This may be particularly beneficial for the $I_A$ and $I_B$ channels, since reducing the amount of time for which the monitor module 110 monitors these channels should reduce the amount of power consumption caused by the monitor module 110. Additionally, reducing the U_RATIO for any channel may free up space for other channels that may need a larger U_RATIO, for example in order to achieve their target minimum levels of accuracy. Thus, it may be appreciated that it can be helpful to have the U_RATIO for each channel set to a minimum level that should still achieve the target level of accuracy, in order to maximise the amount of time when the monitor module 110 can be operated in operation state (a) (do not monitor any measurement sensors) and thereby reduce power usage.

Run Length Module 1220

The run length module 1220 is configured to determine an individual run length 1225 for each channel of interest. An individual run length determined by the run length module 1220 is to be used by the scheduler 1230 as the individual run length of time, which is the amount of time over which the monitor module 110 monitors a channel at the end of which it returns a monitor result 134 for that channel. As explained earlier, a longer individual run length of time should result in a more accurate CC in the monitor result 134 returned at the end of the run.

However, it has been realised that whilst longer individual run lengths of time may improve accuracy, there are some potential negative consequences. For example, if a very long individual run length of time is used and there is a large impulsive noise event on the measurement sensor that is being monitored, or there is a momentary failure in the measurement sensor that is being monitored, or there is a short tamper event on the measurement sensor that is being monitored, it may affect the monitor result for the entire run. Consequently, the determined CC may be corrupted or very inaccurate and the Cert value may indicate that the monitor result should not be trusted as a result of some sort of event taking place during the run, although very little further information may be discernable. Alternatively, the run may be so long that the CC and Cert for the run are not affected a great deal, such that the event is effectively hidden and cannot be spotted in the CC and Cert.

Thus, it may be beneficial to set the individual run length for each channel to be very short and carry out multiple runs on each channel. For example, if the monitoring time window is 20 minutes and the U_RATIO for channel $I_A$ is 10%, it may beneficial to carry out two separate runs, each with an individual run length of time of 1 minute, rather than carrying out a single 2 minute run. The accuracy of each of these shorter runs may be less than what would be achieved by a single run of 2 minutes (approximately ½ times less accurate in the example monitor module 110 of this disclosure, as explained earlier). However, assuming that the noise levels on the channel are the same, or similar, between the two 1 minute runs, the Cert values on each of the two 1 minute runs should be the same (or similar) to each other, although the CCs may be slightly different due to small changes in noise. If the two CCs are effectively averaged together, we should arrive at a more accurate CC, which should be $\sqrt{2}$ times more accurate than the accuracy of the CCs of the two 1 minute runs taken alone. Thus, the effective Cert of the combined (effectively averaged) two CCs should be substantially the same as the Cert from a single 2 minute run.

Consequently, performing a single run to obtain a single CC or performing two separate runs each of half the length of time and then effectively averaging the two resulting CCs, should result in the same outcome. They both take the same total amount of time and have the same overall accuracy. Thus, it may appear that it is preferable to perform many shorter runs on a channel and then determine the average CC and Cert than to perform a single long run. In particular, if an impulsive event (such as an impulsive noise event, or a brief tamper event, etc) takes place during one of the short runs, it will affect only that short run. When analysing the results, the event may be identified because the Cert and/or CC may be significantly different to the Certs and/or CCs for the other short runs. Thus, it may be more likely that a potential tamper event may be spotted and one or more effective average CCs and Certs may be determined from the other unaffected runs (for example, one effective average CC and Cert for all the runs before the incident and another for all the runs after the incident), so that useful and reliable CC and Cert information may still be obtained in spite of the incident.

It may therefore be thought that very short individual run lengths of time may be desirable. However, it has been recognised that running many short runs may create overheads for the manager 900 in terms of memory usage (in storing all of the monitor results 134) and CPU cycles. Furthermore, as mentioned above with respect to FIGS. 12 and 13, the shorter the run length, the lower the accuracy of the CC returned at the end of the run. Consequently, very short runs may result in Cert values that are so high (i.e., indicate such a high level of inaccuracy) that the corresponding CC cannot be relied upon. If this occurs, an impulsive event taking place during the run may not be identifiable (for example, if an impulsive event causes the transfer function of a measurement sensor to briefly change by 5%, but the Cert value is 10%, the change in the transfer function caused by the impulsive event will be within the +/−10% error bar of the Cert value meaning that the change in transfer function may not be spotted).

Thus, it has been realised that the individual run length of time set for each channel by the run length module 1220 should balance the pros and cons of short and long individual run lengths.

On initial start-up of the manager 900, there will be no previous monitor results 1240 available to the run length module 1210, so the individual run lengths 1225 for each channel of interest may be determined based on static run length settings, which are particular settings within the static monitor settings. The static run length settings comprise a minimum run length setting indicative of a minimum length of time for individual runs, and/or a maximum run length setting indicative of a maximum length of time for individual runs. The minimum run length setting may have been set to be an amount of time that should result in acceptable memory and CPU overheads. The maximum run length setting may have been set to be an amount of time that presents an acceptable risk of missing impulsive events in the monitor result 134 and/or having the CC in the monitor result 134 corrupted by an impulsive event. The run length module 1210 may be configured initially to set the individual run lengths 1225 for each channel of interest to a value between the minimum and maximum length of time. In one particular example, it may be configured to initially set the individual run lengths 1225 to the minimum length of time in order to minimise initial power usage and then later increase the individual run lengths 1225 as necessary based on the previous monitor results 1240.

After the monitor module 110 has returned at least one set of monitor results 134, the run length module 1220 may obtain one or more previously determined monitor results 1240 (in an analogous way to that described above in respect of the utilisation module 1210). The run length module 1220 may then compare the Cert values in the one or more previously determined monitor results 1240 against a target certainty value. For example, Cert values in one or more previously determined monitor results 1240 relating to a particular channel may be compared with a target certainty value for that particular channel. If the Cert values fail to achieve the target certainty value (i.e., the accuracy indicated by the Cert values is a lower level of accuracy than is required by the target certainty value), the run length module 1220 may increase the individual run length for that channel, which should result in future monitor results 134 for that channel having a better Cert value. When two or more previously determined monitor results 1240 for a particular channel are considered by the run length module 1220, the run length module 1220 may compare an effective average of the accuracy of those two or more results against the target accuracy and adjust the individual run lengths 1225 based on that comparison. The amount by which the individual run length is increased may be based on the amount by which the Cert values in the one or more previously determined monitor results 1240 fall short of the target certainty value. For example, in the monitor module 110 configuration described above, increasing the individual run length of time by a factor of four should improve the Cert by a factor of two. Consequently, if the target certainty value is 1.25% (i.e., the determined CC should be accurate to within +/−1.25%) and the Cert in the one or more previously determined monitor results 1240 is 2.5%, the individual run length of time may be made four times longer than that which was used when determining the one or more previously determined monitor results 1240.

It should be noted that the target certainty value(s) used for the determination of individual run lengths 1225 is different to the target minimum and/or maximum levels of accuracy used for the determination of U_RATIOs described earlier. The target certainty values may be set in order to achieve the base balance between the pros and cons of run lengths (as described earlier) and based on the minimum size of impulsive events that are desired to be detected.

Additionally or alternatively, if the Cert values in the one or more previously determined monitor results 1240 relating to a particular channel exceed the target certainty value for that channel (i.e., the accuracy indicated by the Cert values is better than the level of accuracy required by the target certainty value), the run length module 1220 may be configured to reduce the individual run length for that channel in order to improve the chances of detecting short impulsive events (as explained earlier, these may be hidden within long individual run lengths) and limit the corruption of the results caused by impulsive events (since an impulsive event during one relatively short individual run length of time should mean that there will be many other measurements determined during other relatively short individual run lengths of time that are not affected by the impulsive event).

In this way, the individual run lengths 1225 may be set to values to enable each monitor result to reach a desired level of accuracy, such that the determined CCs may be reliable, whilst still minimising the risk of missing sensor events.

As described earlier in respect of FIG. 15, the utilisation module 1210 and the run length module 1220 may repeat Steps S1510 and S1520 respectively any number of times, each time utilising the most recent previously determined monitor results 1240. Consequently, the U_RATIOs 1215 and the individual run length 1225 may be regularly updated and altered, such that the requirements of the static monitor settings may be better met over time.

Scheduler 1230

The scheduler 1230 is configured to select the operating state for the monitor module 110 in Step S1530 and then in Step S1540 perform a control action to implement the selected operating state for an individual run length period of time. Selection of an operating state may be based on the U_RATIOs 1215. On initial start-up of the manager 900, the scheduler 1230 may simply select the channel of interest with the largest U_RATIO. The scheduler 1230 may then communicate a first control instruction to the monitor module 110 to monitor the selected channel for a first individual run length of time to determine a first monitor result. The first individual run length of time may be the individual run length 1225 determined by the run length module 1220 for the selected channel. Such a control instruction may be applied by the scheduler 1230 by setting the control instructions 132 to enable the monitor module 1110 (the enable/disable command) and choose the selected channel (the channel select command) and optionally also select the power setting (for example, normal or low power). The scheduler 1230 may apply this control instruction for an amount of time matching the first individual run length of time. To that end, the scheduler 1230 may comprise a counter to count the amount of time for which the control instruction has been applied and then stop the control instruction when the amount of time equals the first individual run length of time. In an alternative, the control instructions may take any other suitable form, according to the configuration of the monitor module 110 (for example, they may comprise any form of suitable signalling to instruct monitoring of the selected channel for the first individual run of time).

After an individual run has been completed and the monitor result 134 is returned to the manager 900, the scheduler 1230 may return to Step S1530 and determine which operating state to select next. At this point, the scheduler 1230 may consider the previously determined monitor results 1240 (it may obtain one or more previously determined monitor results 1240 in an analogous way to that described above in respect of the utilisation module 1210) and compare the U_RATIOs 1225 against the current utilisation (U_CURRENT) of each of the channels of interest. The U_CURRENT of a channel may be determined from the one or more previously determined monitor results 1240 (or the scheduler 1230 may simply keep track of the amount of time for which it has instructed each of the channels to be monitored) and is indicative of the proportion of the monitoring time window that has already been spent by the monitoring module 110 determining monitoring results for that channel.

Figure 16:
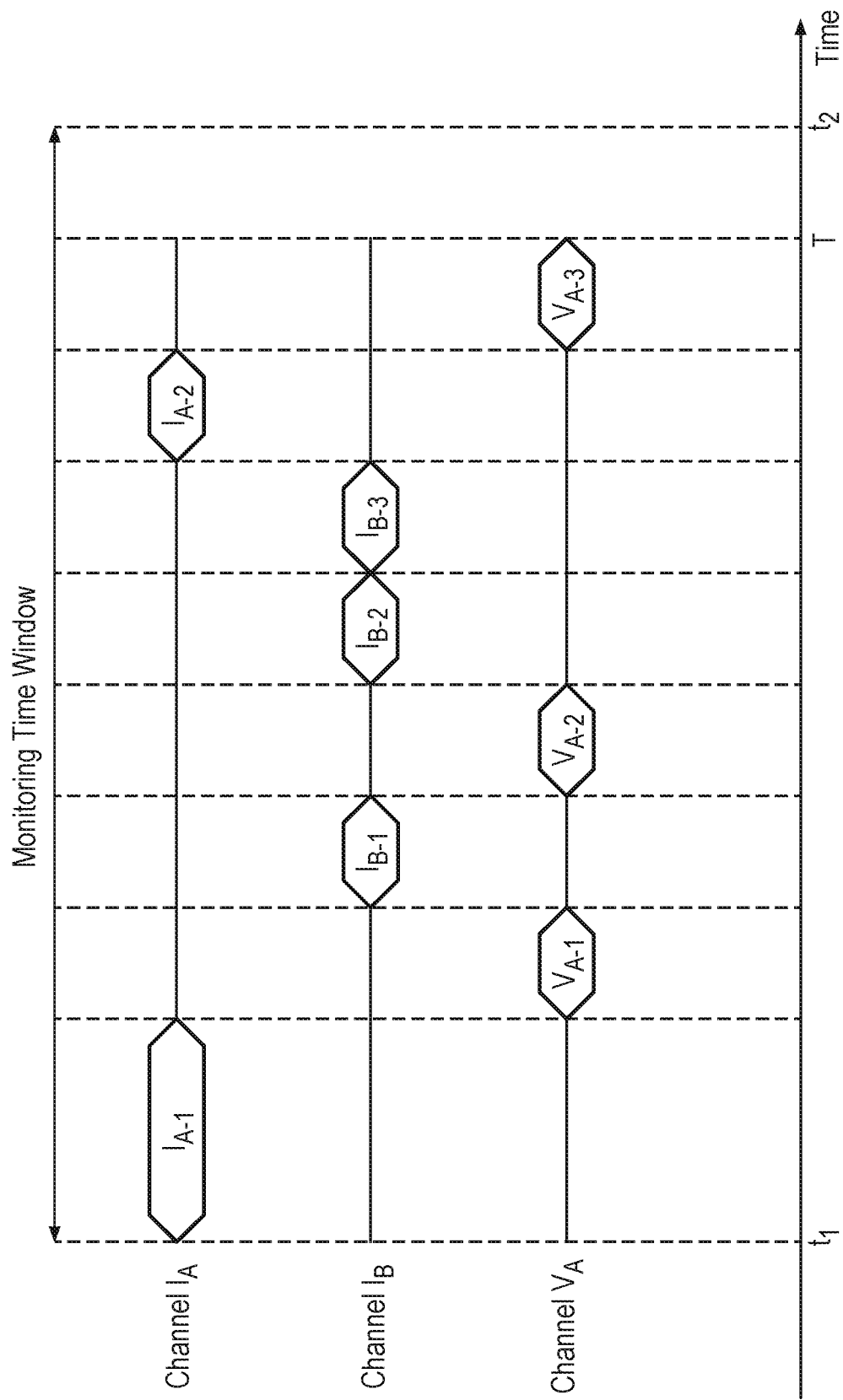
FIG. 16 shows an example of the timing of control functions performed by the controller module of FIG. 14.

FIG. 16 shows an example illustration of channel monitoring performed by the monitor module 110, which may assist in understanding the U_CURRENT. In this example, the monitoring time window is a fixed position window that starts at a particular time $t_1$ and ends at a later time $t_2$. There are three channels of interest $I_A$, $I_B$ and $V_A$, and the time during which each channel has previously been monitored within the monitoring time window is represented by the boxes $I_{A-1}$, $I_{A-2}$, $I_{B-1}$, $I_{B-2}$, $I_{B-2}$, $V_{A-1}$, $V_{A-2}$ and $V_{A-3}$. As can be seen, at any one time, the monitor module 110 is monitoring only one of the channels of interest. Time T is the "current time", which is the time at which the monitoring module 110 has just finished an individual run on a channel (in this case, run $V_{A-3}$ on channel $V_A$) and returned a monitor result 134 for that channel. The U_CURRENT for each channel is the proportion of the monitoring time window that has already been spent monitoring the channel. For example, for channel $I_A$ it is the sum of the time spent on individual runs $I_{A-1}$ and $I_{A-2}$ divided by the length of the monitoring time window. For channel $I_B$ it is the sum of the time spent on individual runs $I_{B-1}$, $I_{B-2}$ and $I_{B-3}$ divided by the length of the monitoring time window. For channel $V_A$ it is the sum of the time spent on individual runs $V_{A-1}$, $V_{A-2}$ and $V_{A-3}$ divided by the length of the monitoring time window.

If the U_CURRENT for all of the channels of interest is equal to or exceeds the U_RATIOs, the scheduler 1230 may select operating state (a) (do not monitor any channels). In this case, the control action in Step S1540 may depend on the configuration of the monitor module 110. For example, it may be to communicate a control instruction to the monitor module 110 to disable the monitor module 110 for a period of time that ends at the end of the monitoring time window (at time $t_2$), at which point a new time window may begin and the scheduler will return to Step S1530 to determine the operation state to be selected for the next individual run.

If the U_CURRENT for only one channel of interest is less than its U_RATIO (i.e., the remaining channels of interest have a U_CURRENT equal to or exceeding their U_RATIO) the scheduler 1230 may select an operating state to monitor that channel of interest (for example, operating state (b), (c) or (d) described above) and perform a corresponding control action, as described earlier.

To assist in this determination process, the scheduler 1230 may determine a U_STATUS for each channel of interest as follows:

$$U\_STATUS = U\_CURRENT / U\_RATIO$$

If U_STATUS for a channel is greater than or equal to 1, then the U_RATIO for that channel has already been satisfied and it should not be selected. If the U_STATUS for a channel is less than 1, the U_RATIO for that channel has not yet been satisfied and it should be selected.

If the U_CURRENT for two or more channels of interest is less than its corresponding U_RATIO (i.e., the U_STATUS of two or more channels is less than 1), then either of the channels may be selected. Preferably, the channel with the lowest U_STATUS may be selected, since it is the channel most far behind its U_RATIO.

As a point of interest, it can be seen in FIG. 16 that $I_{A-2}$ has a shorter individual run length of time than $I_{A-1}$. This may be because the run length module 1220 shortened the individual run length 1225 for channel $I_A$ mid-way through the monitoring time window.

Figure 17:
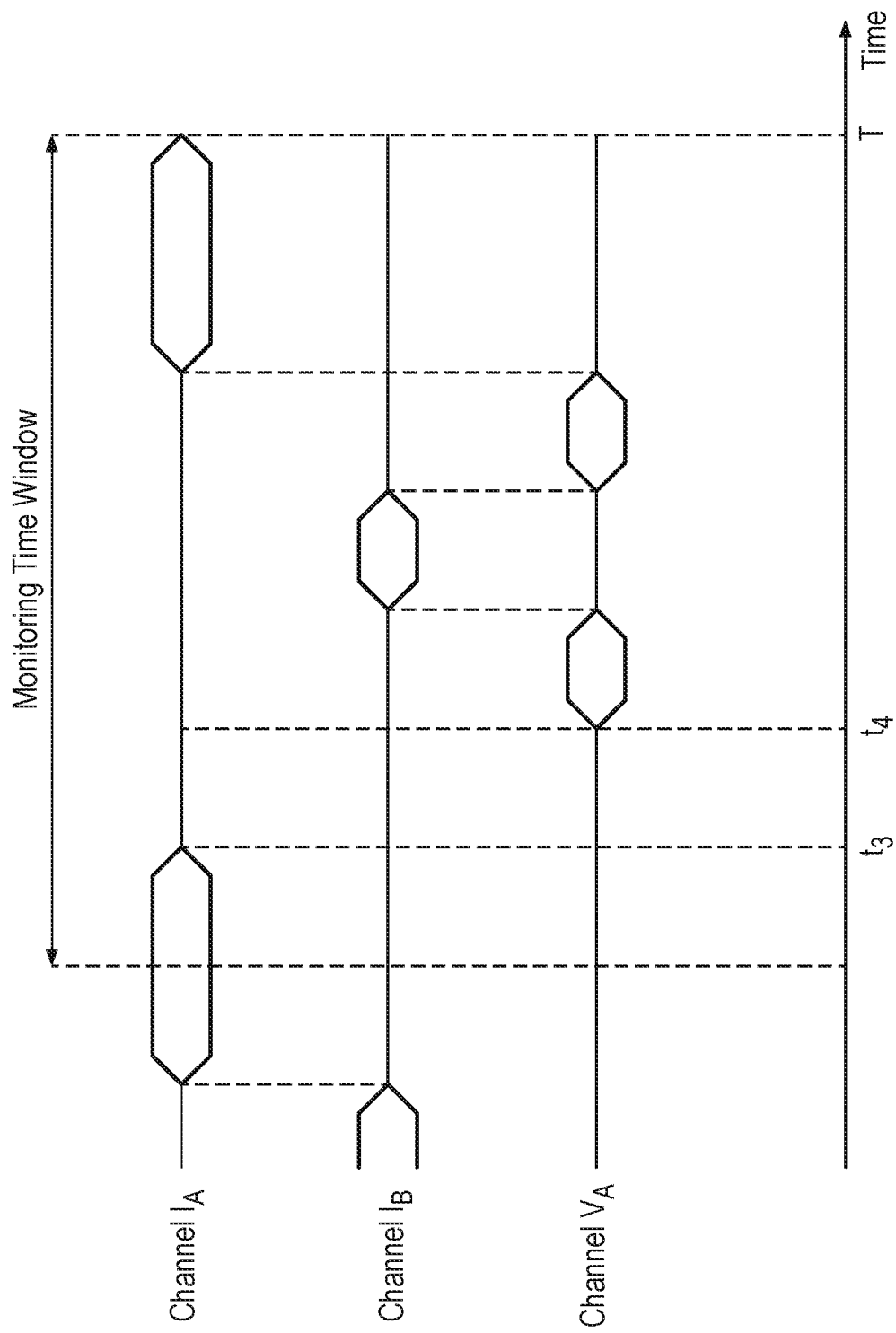
FIG. 17 shows a further example of timing of control functions performed by the controller module of FIG. 14.

FIG. 17 shows an alternative example illustration of channel monitoring performed by the monitor module 110. In this example, the monitoring time window is a rolling time window and represents a particular fixed period of time in the past. Consequently, the end of the window is always the current time, T, and the start of the window is some fixed period of time in the past. Therefore, at time T, the scheduler 1230 considers the U_CURRENT for each channel based on previously determined monitor results 1240 that were determined within the monitoring time window and selects an operation state for the monitor module 110 based on the U_CURRENTs and U_RATIOs as explained above (for example, by determining U_STATUS for each channel and selecting the operating state based on the U_STATUS of each channel). If operation state (a) is selected, the monitor module 110 may be configured to apply that state to the monitor module 110 for a predetermined period of time (for example, a period of time set in the static monitor settings), before returning to Step S1530.

It can be seen that during a period of time $t_3$ to $t_4$ in FIG. 17, none of the channels were being monitored. During this time, the scheduler 1230 would have selected operational state (a) for the monitor module (for example, because at time $t_3$ the scheduler 1230 determined that the U_STATUS of all channels in the rolling time window was is greater than or equal to 1), before then selecting channel $V_A$ at time $t_4$ (for example, because at time $t_4$ the scheduler determined that the U_STATUS for channel $V_A$ in the rolling time window was less than 1).

This approach to scheduling may help the monitoring of different channels of interest to be spread more evenly in time. For example, if the individual run lengths 1225 for each channel are relatively short, the timing of each run may be spread quite evenly. This may be desirable to give each channel good diversity over time, thereby improving the chances that an impulsive event on one of the measurement sensors 120 is identified.

Whilst the above describes one particular implementation of the controller 1110, it will be appreciated that various alternatives are possible. For example, in the above the individual run lengths 1225 are variable. Whilst there may be benefits to the run length module 1220 varying the individual run length of time based on one or more previously determined Cert values, in an alternative the individual run lengths may be fixed, such that each individual run length of time is a fixed length of time. In this instance, the controller 1110 may still increase or decrease the total amount of time spent monitoring each channel over the monitoring period of time by virtue of the operating state selection performed by the scheduler 1230.

Furthermore, whilst selection of the operating state of the monitor module 1110 is described in detail above with reference to U_RATIOs, it will be appreciated that the controller 1110 may alternatively select a monitor module state in any other suitable way. For example, it may utilise one or more previously determined Cert values in any suitable way in order to make the selection. In one example, it may make the selection such that the proportion of time spent by the monitor module monitoring a particular channel during a monitoring time window is sufficient to achieve a desired level of accuracy for the effective average CC determined during the monitoring time window. In another example, where there are a plurality of channels of interest, the selection may be based on target levels of certainty for each of the channels of interest. For example, the selection may be made in order to optimise the proportion of time spent monitoring each channel during the monitoring time window based on target levels of accuracy for each channel of interest (in particular, it may not be possible to achieve the target level of accuracy for all of the channels of interest, in which case the selection may be optimised so that the achieved effective average Cert on each channel gets as close as possible to the respective target level of accuracy, rather than having some channels achieve the target level of accuracy and others fall a long way short).

Thus, it will be appreciated that whilst it may be preferable to select the monitor module operating state based on previous Cert values and also have variable individual run lengths in order to achieve the best balance between accuracy and reliability of CCs and maximising the chance of identifying sensor events, these features are not essential to the disclosure.

Profiler 1120

The profiler 1120 is responsible for obtaining and storing monitor results 134 from the monitor module 110 and for performing pattern and status profiling to identify particular patterns and abnormalities in each of the channels of interest.

Figure 18:
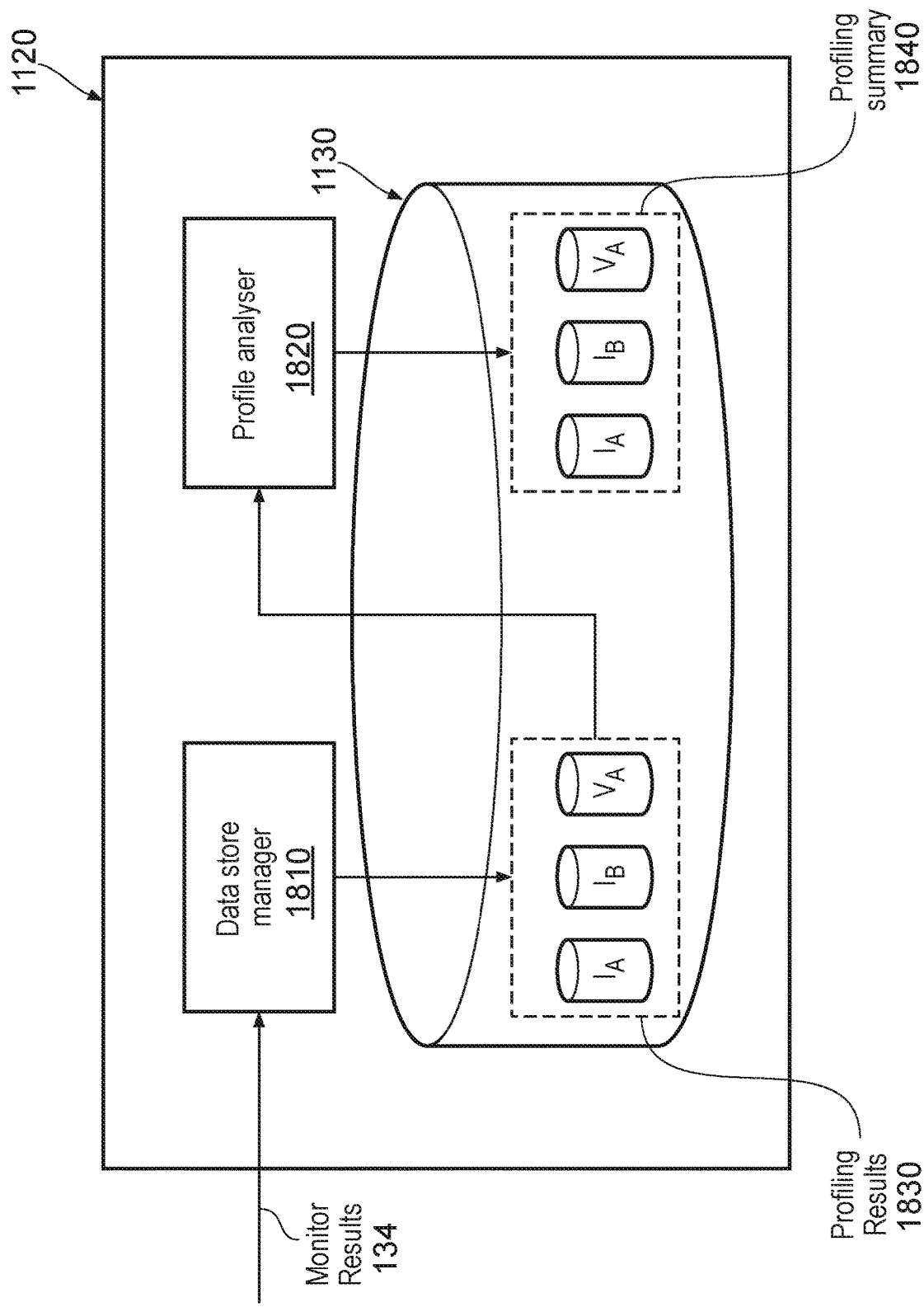
FIG. 18 shows a block diagram of example sub-modules of a profiler module of the manager apparatus of FIG. 9.

FIG. 18 schematically illustrates an example implementation of the profiler 1120. The example implementation of the profiler 1120 comprises a data store manager 1810 and a profile analyser 1820, as well as profiling results 1830 and a profiling summary 1840 within the database 1130. The profiling results 1830 and profiling summary 1840 are represented as being in distinct parts of the database 1130, however it will be appreciated that these data may be stored in the database 1130 using any suitable database storage technique.

Figure 19:
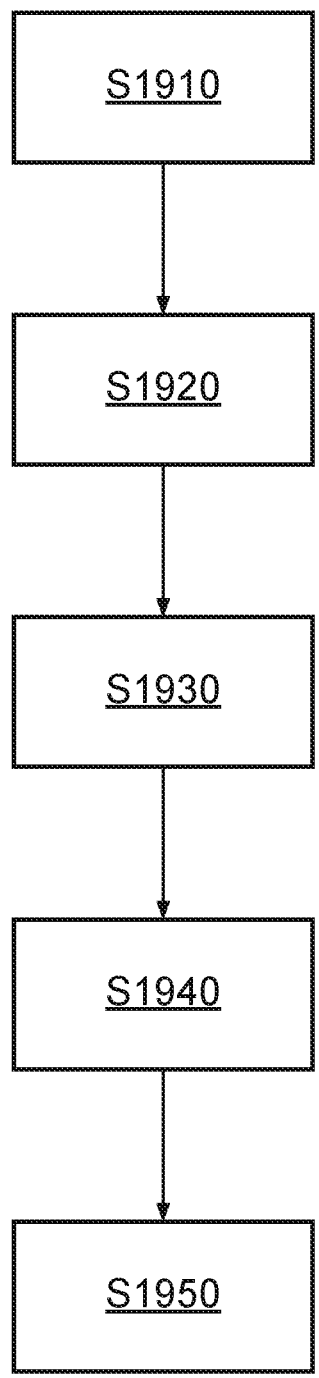
FIG. 19 shows an example flow diagram representing the operation of the profiler module of FIG. 18.

FIG. 19 shows an example flow diagram representing the operation of the profiler 1120. Steps S1910-S1940 shall be described below in relation to the operation of each of the data store manager 1810 and the profile analyser 1820.

Data Store Manager 1810

In step S1910, the data store manager 1810 obtains a monitor result 134 from the monitor module 110. As explained earlier, the obtained monitor result 134 comprises a CC and a Cert for a particular channel of interest (for example, one of channel $I_A$, channel $I_B$ or channel $V_A$) that were determined by the monitor module 110 over an individual run length of time. The data store manager 1810 may obtain the monitor result 134 from the monitor 110 in any suitable way, as explained earlier. The data store manager 1810 may then keep a record of the obtained monitor result 134, for example storing it somewhere in the database 1130, such as part of the profiling results 1830 in the database 1130 or elsewhere in the database 1130, or in memory 140, or in some other memory or cache. Optionally, the data store manager 1810 may at this time filter out any invalid data received from the monitor module 110, for example by comparing the received monitor results to static limits and discarding any monitor results that are outside of the static limits. In this case, an error code may be stored by the profile analyser 1820 as part of the general statistics (explains in more detail later) so that the presence of invalid data may be reported. The causes of invalid data may include communications issues between the monitor module 110 and the manager 900 and/or extreme noise at the input to the monitor module 110 and/or a failure/malfunction in the monitor module 110.

FIG. 18 shows the profiling results 1830 comprising three parts, $I_A$, $I_B$ and $V_A$. This is representative of profiling results relating to each of the channels of interest in this example, which are channel $I_A$, channel $I_B$ and channel $V_A$. Whilst each of the channels of interest are represented as having distinct parts within the profiling results 1830, it will be appreciated that these data may be stored in the database 1130 using any suitable database storage technique.

The data store manager 1810 may repeat Step S1910 each time a new monitor result 134 is available from the monitor module 110. Thus, over time, a plurality of monitor results 134 may be obtained by the data store manager 1810 and stored in some way (for example, as profiling results 1830). Consequently, a plurality of profiling results 1830 for each of the channels of interest $I_A$, $I_B$ and $V_A$ may gradually accumulate over time.

Over a long period of time, particularly if a large number of monitor results 134 are generated by the monitor module 110 (for example, because the individual run lengths 1225 are set by the run length module 1220 to relatively short periods of time), the size of the data may become problematic, particularly if there is only limited memory space available on the MCU 110 for the database 1130. In view of this, the data store manager 1810 may seek to reduce the amount of data stored for the profiling results 1830.

In Step S1920, the data store manager 1810 may reduce the size of the stored data. In particular, for an uneventful period of time on a particular channel of interest, assuming fairly consistent load conditions, a successive series of monitor results for that particular channel should have similar Cert values and have similar CCs. Thus, rather than storing all of the individual monitor results during an uneventful period of time, the data store manager 1810 may seek to store only one profiling result comprising a single CC and corresponding Cert for that entire uneventful period of time.

However, if the CC and/or Cert of a monitor result for a particular channel is significantly different to the CCs and/or Certs in preceding and/or subsequent monitor results for that channel, this may be indicative of a sensor event (as explained in more detail later in the section 'profile analyser 1820'). It is therefore desirable that this information is not lost. Consequently, in Step S1920 the data store manager 1810 may identify two or more monitor results relating to a particular channel that were determined in successive periods of time (i.e., successive individual run lengths of time) and have similar CCs and/or Certs and then store a single profiling result based on those identified two or more monitor results. In this way, the data storage requirements for the profiling results 1830 may be reduced compared with each individual monitor result being stored in the database 1130 as a profiling result. This is explained in more detail with reference to FIGS. 20, 21 and 22.

Figure 20:
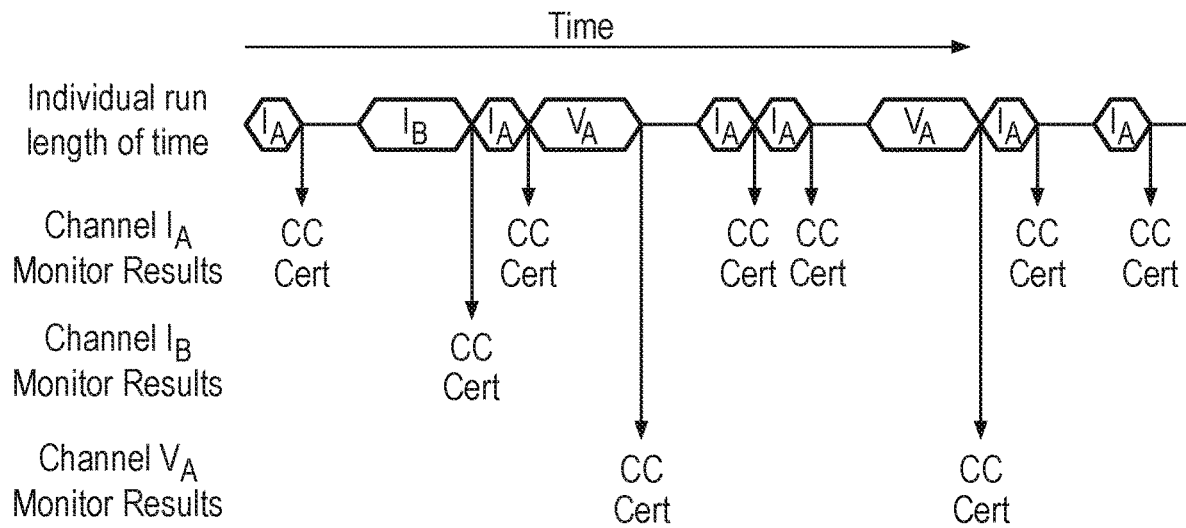
FIG. 20 shows an example representation of individual run lengths of time during which the monitor module of FIG. 11 determines monitor results.

FIG. 20 shows an example representation of individual run lengths of time during each of which the monitor module 110 determines monitor results 134 for a channel of interest. Individual run lengths of time labelled $I_A$ signify the monitor module 110 monitoring channel $I_A$, individual run lengths of time labelled $I_B$ signify the monitor module 110 monitoring channel $I_B$, and individual run lengths of time labelled $V_A$ signify the monitor module 110 monitoring channel $V_A$. At the end of each individual run length of time, the data store manager can obtain the monitor result 134 for that channel.

Figure 21:
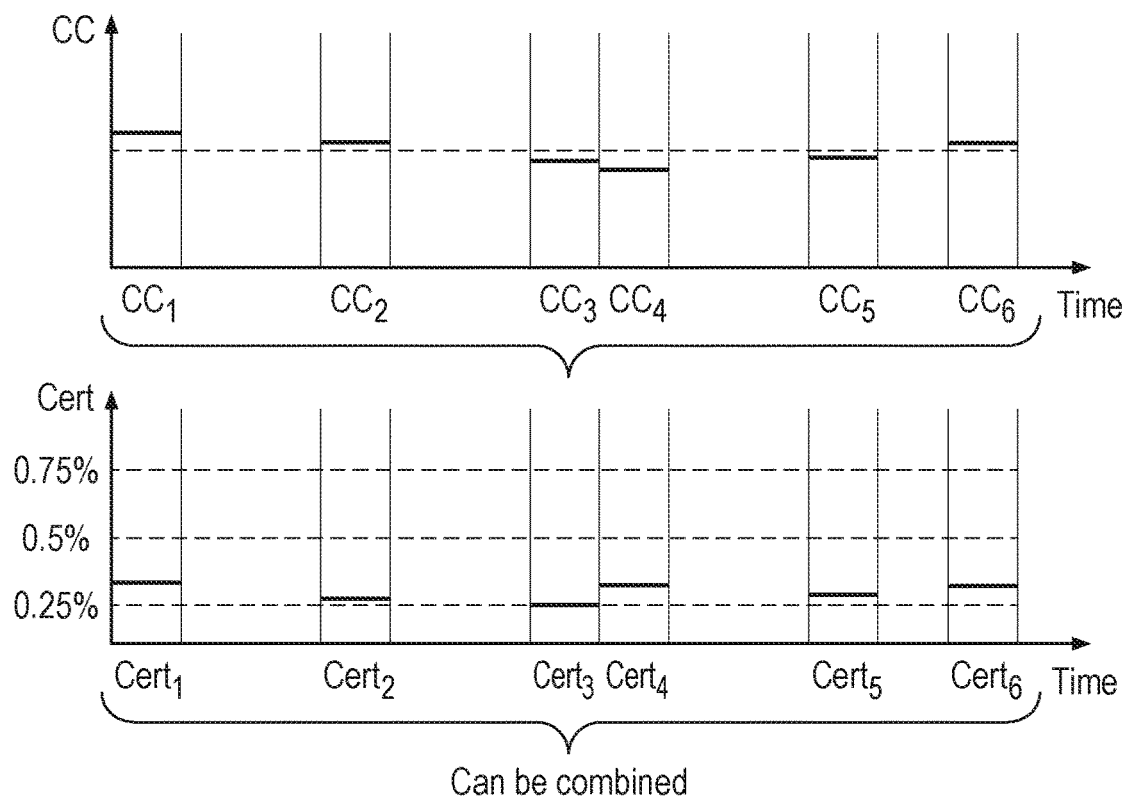
FIG. 21 shows an example representation of monitor results.

FIG. 21 shows an example representation of the CC and Cert values in each of the monitor results 134 relating to channel $I_A$. The CC representation includes a dotted line, representing the effective average of each of the CCs for $I_A$. It also includes a number of short solid lines, each representing a CC in one of the monitor results. The Cert representation shows the Cert corresponding to each CC. In this particular example, the Cert in each of the monitor results for channel $I_A$ is between 0.25% and 0.5%. The data store manager 1810 may determine that all six sets of monitor results relating to channel $I_A$ comprise Cert values that better a particular threshold minimum level of certainty. By way of example, the threshold minimum level of certainty may be 0.5%, in which case all Cert values represented in FIG. 21 better that level of certainty (i.e., they all have a lower Cert value than the threshold minimum level of certainty, indicating a better or higher level of certainty than that required by the threshold minimum level of certainty). Thus, there are six successive monitor results for channel $I_A$ that meet the threshold minimum level of certainty. The threshold minimum level of certainty may be set to any suitable value and may, for example, be one of the static settings described earlier.

Furthermore, the data store manager 1810 may also determine that all six sets of monitor results comprise CC values that are within an averaging threshold of each other (for example, the maximum difference between all of the CCs is less than the averaging threshold). The averaging threshold may be set to any suitable value, and may be based on at least one of the Cert values in the monitor results. For example, it may be set to the smallest Cert value of the monitoring results represented in FIG. 21 (approximately 0.3%), such that all CC values must be within 0.3% of each other. In this case, only CC values that fall within the margin of error indicated by the smallest Cert value may be averaged together. Alternatively, the averaging threshold may be set to a fixed valuable, for example as part of the static settings described earlier.

Thus, for the monitor results represented in FIGS. 20 and 21, in Step S1920 the data store manager 1810 may identify six monitor results relating to channel $I_A$ that were all determined by the monitor module 110 in successive individual run lengths of time, that all comprise CCs meeting the averaging threshold requirement and that all comprise Certs meeting the threshold minimum level of certainty requirement. Consequently, the data store manager 1810 may store a single profiling result for channel $I_A$ in the profiling results 1830, rather than six individual profiling results (corresponding to the six individual monitor results). The individual profiling result will have a single CC value determined based on the CCs in the six individual monitor results (for example, an effective average of the CCs in the six individual monitor results). The individual profiling result will also have a single Cert that is an effective average Cert based on the Certs in the six individual profiling results. A suitable technique for determining an effective average Cert may depend on the configuration of the monitor module 110, in particular its relationship between how increasing the cumulative run length affects the overall certainty. For the particular implementation of monitor module 110 described earlier, the effective average CC may be determined based on each of the individual CCs and their corresponding Certs as follows.

Each of the individual CCs may first be weighted based on their corresponding Cert. For example, if there are six individual CCs and corresponding Certs, the CCs may be weighted as follows $CC_1/Cert_1^2$
$CC_2/Cert_2^2$
$CC_3/Cert_3^2$
$CC_4/Cert_4^2$
$CC_5/Cert_5^2$
$CC_6/Cert_6^2$ In this instance, it can be seen that the weighting is performed on the basis of $Cert^2$.

An effective average CC, referred to from hereon as $CC_w$, may then be found using Cert values as follows:

$$CC_w = \frac{\frac{CC_1}{Cert_1^2} + \frac{CC_2}{Cert_2^2} + \frac{CC_3}{Cert_3^2} + \frac{CC_4}{Cert_4^2} + \frac{CC_5}{Cert_5^2} + \frac{CC_6}{Cert_6^2}}{\frac{1}{Cert_1^2} + \frac{1}{Cert_2^2} + \frac{1}{Cert_3^2} + \frac{1}{Cert_4^2} + \frac{1}{Cert_5^2} + \frac{1}{Cert_6^2}}$$

An effective weighted average certainty, referred to from hereon as $Cert_w$, may also be determined as follows:

$$Cert_w = \frac{1}{\sqrt{\frac{1}{Cert_1^2} + \frac{1}{Cert_2^2} + \frac{1}{Cert_3^2} + \frac{1}{Cert_4^2} + \frac{1}{Cert_5^2} + \frac{1}{Cert_6^2}}}$$

Thus, determination of the effective average CC, $CC_w$, may be generalised to:

$$CC_w = \frac{\sum \frac{CC_i}{Cert_i^2}}{\sum \frac{1}{Cert_i^2}}$$

and determination of the effective average Cert, $Cert_w$, may be generalised to:

$$Cert_w = \frac{1}{\sqrt{\sum \frac{1}{Cert_i^2}}}$$

It will be appreciated that this is merely one non-limiting example of how $CC_w$ and $Cert_w$ may be determined and that any other techniques may alternatively be used.

Whilst FIG. 21 shows six successive monitor results meeting the requirements described above, it will be appreciated that the data store manager 1810 may identify any number of two or more successive monitor results meeting the requirements described above and determine a single profiling result to replace them. Optionally, the data store manager 1810 may be configured to limit the number of monitor results that can be combined into a single profiling result based on a static maximum run setting indicative of the maximum number of monitor results that can be combined into a single profiling result. The static maximum run setting may be part of the static settings described earlier.

In Step S1920, the data store manager 1810 may carry out this process for each of the channels of interest, so that data storage requirements for each channel may be reduced.

Figure 22:
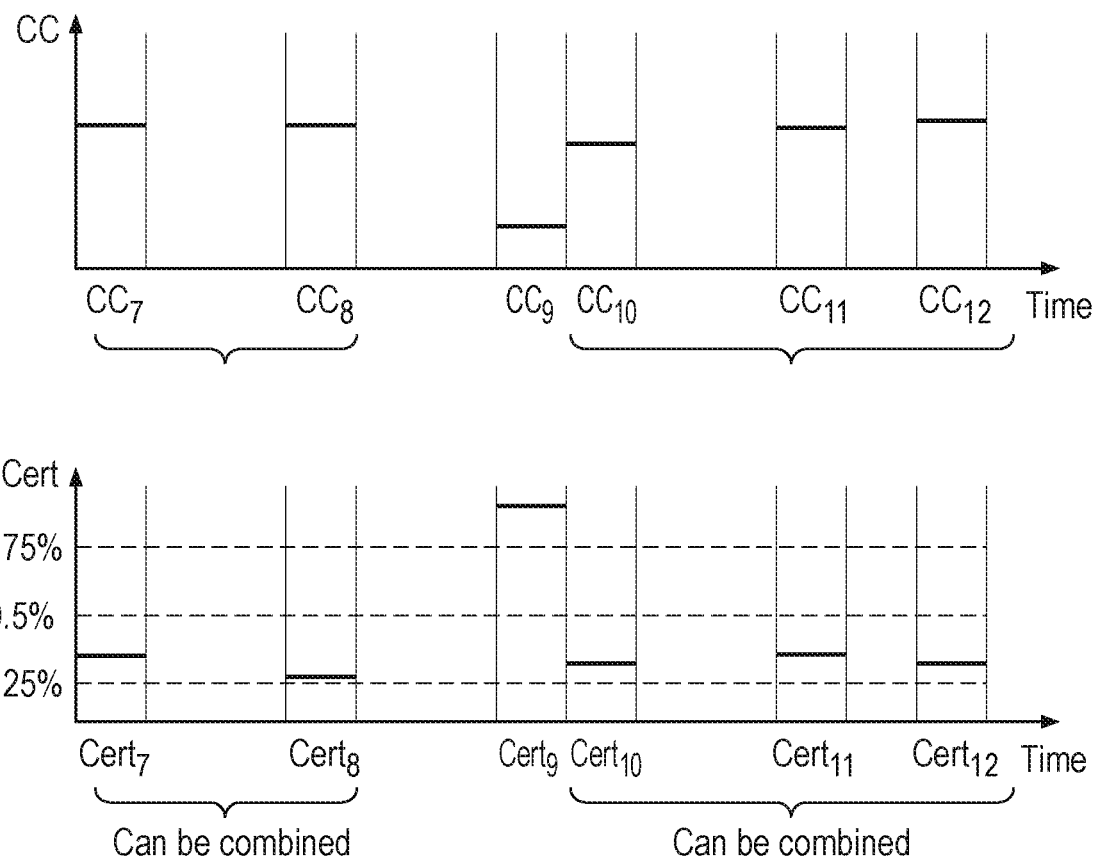
FIG. 22 shows a further example representation monitor results.

FIG. 22 shows a further example representation of CC and Cert values for each of the monitor results 134 relating to channel $I_4$. It can be seen that $CC_9$ is significantly different to the other CC values around it. Likewise, $Cert_9$ is significantly higher than the other Cert values around it. Consequently, the data store manager 1810 may identify that the two successive monitor results relating to $CC_7$ and $CC_8$ meet the explained requirements above and that the three successive monitor results relating to $CC_{10}$ to $CC_{12}$ meet the requirements explained above, but that $CC_9$ does not. Therefore, it may determine three profiling results 1830 to be stored in the database 1130, the first being based on the monitor results relating to $CC_7$ and $CC_8$, the second being the monitor result relating to $CC_9$, and the third being based on the monitor results relating to $CC_{10}$ to $CC_{12}$. Consequently, the amount of data required for the storage of profiling results 1830 may be reduced compared with storing all of the monitor results, but without losing the data from the monitor result relating to $CC_9$, which may be useful for effective profiling, as explained later in the section 'profile analyser 1820'.

It will be appreciated that the data store manager 1810 may be configured to combine successive monitor results that meet either of the CC and Cert requirements above, or more preferably that meet both of the CC and Cert requirements above (particularly since a monitor result with a significant change in CC but a low corresponding Cert—i.e., a good levels of certainty—may be indicative of a particularly significant sensor event, as explained later, and so should preferably not be lost by performing this process).

Thus, Step S1910 may be repeated a number of times and then Step S1920 may be periodically undertaken by the data store manager 1810 to determine whether or not the amount of data to be stored could be reduced. For example, each obtained monitor result could be initially stored as a profiling result 1830 in the database 1130. Periodically, the data storage manager 1810 could undertake Step S1920 to try to identify two or more successive monitor results meeting the above disclosed requirements, delete those monitor results from the profiling results 1830 and replace them with a single profiling result. Thus, at some times, each of the profiling results 1830 will correspond to a respective single monitor result and at other times (for example after Step 1920 has been successfully undertaken) one or more of the profiling results 1830 may be based on two or more monitor results whilst others of the profiling results 1830 may be based on a respective single monitor result (for example, where the single monitor result did not meet the CC and Cert requirements explained above).

In addition to a CC and Cert, each profiling result may further comprise a time indicator, indicative of some characteristic of the timing of when the CC and Cert were determined. For example, where the profiling result is based on a single monitor result, it may comprise the start time of the individual run length of time used by the monitor module 110 to determine the monitor result and/or the end time of the individual run length of time used by the monitor module 110 to determine the monitor result and/or the duration of the individual run length of time used by the monitor module 110 to determine the monitor result. Where the profiling result is based on two or more monitor results (for example, because two or more monitor results have been combined into a single profiling result, as described above), it may comprise the start time of the earliest individual run length of time of the two or more monitor results and/or the end time of the latest individual run length of time of the two or more monitor results and/or the sum of the durations of the individual run lengths of time of the two or more monitor results and/or the number of monitor results that have been combined to make up the profiling result.

It will be appreciated that in the present disclosure, the term 'successive' is not intended to mean continuous or consecutive, but instead means two or more monitor results relating to a particular channel that follow one after another (either immediately after each other or sometime after each other). Thus, there may be time gaps between successive monitor results (as can be seen in FIG. 21, where each of the monitor results are successive and meet the CC and Cert requirements identified above, but still have time gaps between when each was determined by the monitor module 110).

Profile Analyser 1820

In Step S1930, the profile analyser 1820 obtains a plurality of the profiling results 1830 relating to one of the channels of interest $I_A$, $I_B$ or $V_A$, for example by retrieving them from the database 1130. The profile analyser 1820 may retrieve only profiling results 1830 relating to a particular profiling period of time (for example, the last 6 hours, or the last 12 hours, or the last 24 hours, etc), for example by using the time indicator in each of the profiling results. The profiling period of time may be related to a static reporting period setting, which is a static setting and is explained in more detail below in relation to the report generator 1140. For example, if the static reporting period setting is set to 8 hours, roughly every 8 hours the profile analyser 1820 may obtain profiling results 1830 relating to the previous 8 hour period, so that CCs and Certs determined by the monitor module 110 during the profiling period of time may be profiled.

In Step S1940, the profile analyser 1830 generates a profiling summary based on the obtained profiling results. This may include determining general statistics and/or identifying sensor events.

Sensor events may be determined based on the CCs and/or Certs in the plurality of profiling results obtained by the profile analyser. In particular, the profile analyser 1830 may analyse the obtained profiling results relating to one channel of interest at a time (for example, analysing the profiling results relating to channel $I_A$ first, then analysing the profiling results relating to channel $I_B$, then analysing the profiling results relating to channel $V_A$), or in parallel. The analysis for each channel may seek to identify CCs in the profiling results that are indicative of a sensor event having taken place, for example CCs that are significantly different to a benchmark transfer function value for that channel. Each channel may have its own benchmark transfer function, which may be a static setting that is set to be the value of the transfer function of the channel at the time of manufacture and/or calibration of the manager 900. Any profiling results for a particular channel that comprising a CC that is different (either greater than or lesser than) the benchmark transfer function for that channel by more than an event threshold amount may be identified as being indicative of a sensor event. The event threshold amount may comprise one or more a static settings and may be set to any suitable values (for example, a percentage value, such as 0.5%, or 5%, or 8%, or an absolute value, such as 1.3, or 4.2, etc). Thus, small changes in CC that may be caused by noise may be ignored as not relating to a sensor event, whereas large changes in CC may be identified as being indicative of a sensor event.

There may be two different types of sensor event: a burst event or a change event. A burst event is indicative of a temporary change in the transfer function of the measurement sensor, for example caused by a tamper event or attempted tamper event. A change event is indicative of a lasting change in the transfer function of the measurement sensor, for example caused by sensor drift or aging.

A burst event may be identified from the CCs in the profiling results in any suitable way. In one non limiting example, the profile analyser 1820 may identify that the profiling results at the beginning and end of the profiling period of time have similar CCs (for example, CCs that are different from the benchmark transfer function by less than the event threshold amount), but one or more other profiling results in the profiling period (for example, towards the middle of the profiling period) have CCs that are different from the benchmark transfer function by more than the event threshold amount. This may suggest that the transfer function of the measurement sensor may have been briefly changed, but then returned back to normal, which is indicative of a burst event.

A change event may be identified from the CCs in the profiling results in any suitable way. In one non limiting example, the profile analyser 1820 may identify that profiling results at the beginning of the profiling period of time are quite different to those at the end of the profiling period of time. For example, the profiling results at the beginning may have CCs that are different from the benchmark transfer function by less than the event threshold amount, but then the CCs in profiling results may gradually change during the profiling period of time such that the profiling results towards the end of the profiling period are different from the benchmark transfer function by more than the event threshold amount.

Optionally, the profile analyser 1820 may be further configured to consider the Cert value as part of the identification of sensor events. A significant change in CC that is accompanied by a low level of certainty (in the example of the present disclosure, a relatively high Cert value would indicate that the corresponding CC has a relatively low level of certainty) may be due to some impulsive noise on the power supply line, whereas a significant change in CC that is accompanied by a high level of certainty (i.e., in the example of the present disclosure, a relatively low Cert value would indicate a high level of certainty) is more likely to suggest a genuine change in the transfer function of the measurement sensor.

In one particular example of how the profile analyser 1820 may use Cert as part of the identification of sensor events, the following process steps may be performed.

1. The earliest 'unused' profiling result for the channel being analysed is selected. An 'unused' profiling result is one that is based on one or more monitoring results that were determined during the profiling period and that have not yet been used for identification of sensor events. The term 'earliest' refers to the temporal nature of the profiling results, such that the earliest 'unused' profiling result is the 'unused' profiling result that is based on one or more monitoring results that were determined earlier in time than any other 'unused' profiling result. The selected earliest 'unused' profiling result may be added to a buffer.

2. A weighted effective average Cert, $Cert_w$, is determined based on the Cert value(s) of the selected earliest 'unused' profiling result (i.e., based on the Cert values in the buffer). $Cert_w$ may be determined in the way described earlier, or an effective average Cert, or weighted effective average Cert, may be determined in any other suitable way.

3. $Cert_w$ is compared with a $Cert_{thres}$. $Cert_{thres}$ is indicative of a threshold minimum level of accuracy that should be achieved by $Cert_w$.

If $Cert_w$ fails to achieve the threshold minimum level of accuracy (in the present example where larger Cert values are indicative of low levels of accuracy, if $Cert_w > Cert_{thres}$, or alternatively if $Cert_w \geq Cert_{thres}$, then $Cert_w$ has failed to achieve the minimum level of accuracy), then the process should return to step 1. By returning to step 1, the next profiling result (i.e., the earliest 'unused' profiling result) should be selected and its Cert value may be added to the buffer. As explained earlier, including another Cert value in the determination of $Cert_w$ should improve the level of certainty. Therefore, steps 1-3 may be repeated until the level of certainty of the selected profiling results achieves the threshold minimum level of accuracy indicated by $Cert_{thres}$.

If $Cert_w$ achieves the threshold minimum level of accuracy (in the present example where larger Cert values are indicative of lower levels of accuracy, if $Cert_w \leq Cert_{thres}$, or alternatively if $Cert_w < Cert_{thres}$, then $Cert_w$ has achieved the minimum level of accuracy), then the process should proceed to step 4.

4. $CC_w$ is determined based on the CCs in the profiling results in the buffer. Therefore, a $CC_w$ corresponding to the earliest determined $Cert_w$ is determined. $CC_w$ may be determined in the same way as described earlier, or in any other suitable way.

5. $CC_w$ is compared against the benchmark transfer function. The difference between the two may be stored in memory, for example as part of the profiling summary 1840, particularly where the difference is greater than the event threshold amount, in which case a sensor event may have been identified, as explained earlier.

6. The buffer is cleared and the process may return to step 1 to continue analysing any profiling results that remain 'unused' from the profiling period of time.

It will be appreciated from the above that profiling results may be analysed to identify a sensor event only when the CCs in the profiling result are sufficiently reliable (i.e. sufficiently accuracy) to meet the threshold minimum level of accuracy $Cert_{thres}$. Consequently, the $CC_w$ can be deemed sufficiently accurate to give a reliable determination in step 5 of whether or not there has been a sensor event. Furthermore, by adding profiling results to the buffer step-by-step until the condition in step 3 is met, but adding no more than the minimum number of profiling results in order to meet that condition, effective averaging of profiling results may be minimised, thereby improving the reliability of identifying a sensor event, since the more CCs that go into determining $CC_w$, the greater the chance of a large CC change in one of the profiling results (which may indicate a sensor event) being lost in the $CC_w$ figure, which may reduce the resolution of identification and potentially cause some sensor events to be missed.

Optionally, $Cert_{thres}$ may be based on the event threshold amount. For example, for very small event threshold amounts, a high level of accuracy may be required for $Cert_w$ in order for $CC_w$ to be used to reliably identify a burst or change event. This is because lower certainties in the determination of CCs (for example, caused by noise) may potentially cause $CC_w$ to differ from the benchmark transfer function value by more than the very small event threshold, rather than a burst or change event. However, for very large event threshold amounts, only a relatively low level of accuracy may be required, since noise etc, is unlikely on its own to cause very large changes in CC. By basing $Cert_{thres}$ on the event threshold amount in this way, very significant burst or change events may be very quickly identified from only one or a small number of profiling results, whereas smaller burst or change events may require more profiling results and therefore more time and effort, but may be determined only when there is a sufficient level of accuracy to be confident that a genuine event has taken place, rather than just noise. Thus, very large change or burst events may be determined very quickly and smaller more subtle change or burst events may be determined only when there is confidence of a high level of accuracy in the value of $CC_w$.

There may be one or many event threshold amounts, which may each be static settings. Where the $Cert_{thres}$ is based on the event threshold amount, there may also be a corresponding one or many $Cert_{thres}$, which may also be static settings. Where there are many event threshold amounts, the significance of an identified sensor event may be made more apparent, with reference to the event threshold amount that has been exceeded. For example, it may enable the profiling summary to indicate not only that a sensor event has been detected, but also indicate a magnitude of the difference between the benchmark transfer function and the CC. In the example listed below, there are five different event threshold amounts, being 1%, 4%, 8%, 20% and 50%. However, it will be appreciated that there may be any number, and that each may be of any size. Furthermore, where there are a plurality of different event threshold amounts, the profile analyser 1820 may be configured to perform the sensor event identification steps identified above for each event threshold amount in parallel, such that profiling results may contribute to the identification of different size sensor events in parallel.

Optionally, if step 3 above is repeatedly failed (i.e., $Cert_w$ repeatedly fails to achieve $Cert_{thres}$) until all profiling results in the profiling period of time have been used (for example, they have all been added to the buffer and $Cert_w$ still has not achieved $Cert_{thres}$), this may be indicative of an accuracy failure sensor event, which may be recorded in the profiling summary 1840. An accuracy failure sensor event may indicate that there is some potentially significant issue with the measurement sensor and/or the monitor module 110 which may need investigating.

Additionally, or alternatively, the profile analyser 1820 may compare each CC in the profiling results 1830 to the benchmark transfer function value and determine whether it exceeds a max difference threshold. The max difference threshold may be very large, for example 80%, and exceeding the max difference threshold may be indicative of a signal failure at the monitor module 110, for example caused by a connection/communication failure between the measurement sensors 120 and monitor module 110 and/or between the monitor module 110 and the manager 900. Thus, a difference between a CC and the benchmark transfer function value that exceeds the max difference threshold may be indicative of a signal failure sensor event, which may also be usefully recorded in the profiling summary. Additionally, or alternatively, the monitor module 110 may be configured to report a signal failure sensor event to the manager 900, along with the CC and Cert results.

Whilst the above process for identification of sensor events is determined based on the profiling results 1830 stored in memory at the end of the profiling period of time, in an alternative steps 1-6 described above may be carried out each time a new profiling result becomes available (i.e., step 1 is performed each time a new profiling result is available and if step 3 is passed, steps 4-6 then take place, but if step 3 is not passed, step 1 takes place again as soon as the next profiling result becomes available, etc). In a further alternative, steps 1-6 may be carried out based on monitor results, each time a new monitor result becomes available. The benefit of this is that monitor results and/or profiling results do not need to be stored in the database 1130, thereby reducing memory requirements, but may reduce the flexibility of the process for analysing results over different profiling periods of time.

In Step S1950, having identified a profiling result indicative of a sensor event in Step S1940, the profile analyser 1820 generates an event record indicative of at least one characteristic of the sensor event. The event record may be generated based on the profiling result(s) that is indicative of a sensor event (for example, based on the CC or $CC_w$, Cert or $Cert_w$, and/or time indicator in the profiling result(s)). For a burst event, the at least one characteristic may comprise at least one of a start time of the burst event, the duration of the burst event and/or an indication of the magnitude of the difference between the CC in the identified profiling result and the benchmark transfer function. For a change event, the at least one characteristic may comprise at least one of a time at which the change event occurred and/or an indication of the magnitude of the difference between the CC in the identified profiling result and the benchmark transfer function. For an accuracy failure sensor event, the at least one characteristic may comprise a time at which the accuracy failure event occurred and/or an indication of the event threshold amount (and/or an indication of $Cert_{thres}$). For a signal failure sensor event, the at least one characteristic may comprise at least one of a time at which the accuracy failure event occurred and/or an indication of the magnitude of the difference between the CC in the identified profiling result and the benchmark transfer function.

Some examples of the sort of information that may be include in the event record are set out in the table below. The event record may include at least one of the identified pieces of information:

| Event | Type | Priority | Additional characteristics |
|---|---|---|---|
| CC change > 1% | Burst | 3 | Time of event and/or duration of event |
| CC change > 4% | Burst | 2 | |
| CC change > 8% | Burst | 1 | |
| CC change > 20% | Burst | 1 | |
| CC change > 50% | Burst | 1 | |
| CC change > 1% | Accuracy failure | 3 | Time of event |
| CC change > 4% | Accuracy failure | 3 | |
| CC change > 8% | Accuracy failure | 2 | |
| CC change > 20% | Accuracy failure | 1 | |
| CC change > 50% | Accuracy failure | 1 | |
| CC change > 1% | Change | 3 | Time of event |
| CC change > 4% | Change | 2 | |
| CC change > 8% | Change | 1 | |
| CC change > 20% | Change | 1 | |
| CC change > 50% | Change | 1 | |
| Signal Failure | Signal Failure | 1 | Time of event |

In this example, the event record may comprise an identifier of which 'event' and 'type' identified above applies to the identified sensor event and at least one of the additional characteristics. The 'priority' information is optional information that may be included in the event record, or may be known to the report generator 1140, as explained later. Thus, it can be seen that at least one of an indication of the size of the event (for example, CC change>8%), the type of sensor event and/or a timing of the sensor event may be recorded in the event record. The priority is indicative of the how important the sensor event may be, based on the size of change in CC, which may be useful in report generating, as explained later.

The profile analyser 1820 may determine an event record for each of the channels of interest based on the profiling results 1830 for those channels, so that sensor events taking place on any of the channels may be identified. Whilst each of the channels of interest are represented as having distinct parts within the profiling summary 1840 in FIG. 18, it will be appreciated that these data may be stored in the database 1130 using any suitable database storage technique that is apparent to the skilled person.

Thus, by analysing the profiling results 1830 as described above, potential sensor events may be identified and recorded in the profiling summary 1840. Consequently, the profiling summary 1840 may be used to quickly see if there are any sensor events deemed to have taken place during a period of time so that they may be investigated more fully, for example to conduct a physical investigation of the utility meter system 100 to see if it has been tampered with, etc. Furthermore, the profile analyser 1820 may determine various characteristics relating to identified sensor events which can then be stored in the profiling summary 1840 to provide further information and a clearer picture of any identified sensor events.

Examples of general statistics that may be determined by the profile analyser 1820 to give an overview of profiling results and/or sensor events over the profiling period of time are set out in the table below.

| Information | Priority (1: high, 3: low) |
|---|---|
| Number of individual runs | 3 |
| Average length of individual runs | 3 |
| Effective average CC, $CC_w$ | 1 |
| Difference between $CC_w$ and benchmark transfer function value | 1 |
| Effective average Cert, $Cert_w$ | 2 |
| Number of priority 1 burst events | 1 |
| Number of priority 2 burst events | 2 |
| Number of priority 3 burst events | 3 |
| Priority 1 change event? (YES/NO) | 1 |
| Priority 2 change event? (YES/NO) | 2 |
| Priority 3 change event? (YES/NO) | 3 |

The general statistics determined by the profile analysers 1820 may comprise any one or more of the items listed above for each of the channels of interest. The 'priority' information is optional and may be included in the general statistics, or may be known to the report generator 1140, as explained later. Thus, the profile analyser 1120 may include in the profiling summary 1840 at least some of the information explained above to record specific information regarding each sensor event and/or the general statistics.

The effective average CC, $CC_w$, and the effective average Cert, $Cert_w$, may be determined as described earlier, using some or all of the profiling results from the profiling period of time.

Report Generator 1140

The report generator 1140 is configured to generate the report 164 for communication to the network entity 160 via the communications module 150, so that the network entity 160 may develop an appreciation of activity on the measurement sensors 120. In one implementation, the report 164 generated by the report generator 1140 may be based on the profiling summary 1840 in as much as it simply comprises some or all of the profiling summary 1840 for one or more of the channels of interest. Whilst this represents a significant reduction in the amount of data that needs to be communicated to the network entity 160 (thereby reducing bandwidth requirements and costs for communications) compared with communicating all of the monitor results or profiling results 1830, it may still be a substantial amount of data to communicate. Therefore, more preferably, the report 164 generated by the report generator 1140 may be based on the profiling summary 1840 in that it is derived from at least part of the profiling summary 1840.

The report generator 1140 may use static reporting settings (which may be part of the static settings described earlier) in order to generate periodic reports 164 based on the profiling summary 1840. For example, the static reporting settings may comprise at least one of a static report length setting indicative of a maximum length of the report (for example, 8-bit, or 16-bit, or 32-bit, or 64-bit, or 128-bit, etc); a static periodicity setting, indicative of the regularity with which reports should be generated (for example, it may be set to a length of time equal to the profiling period of time, so that at the end of each profiling period of time, a report is generated based on the profiling summary 1840 that was created by the profile analyser 1820 based on the profiling results 1830 for that period of time) and/or a static priority setting indicating the level of priority of sensor events to be included in the reports. The static report length setting and the static periodicity setting may be set based on the expected bandwidth of the communication channel between the communications module 150 and the network entity 160, in order to tailor the size and regularity of the reports to the expected limitations of the communications channel.

The report generator 1140 may be configured to use the static priority setting to determine which types of information in the profiling summary 1840 to include in the report 164. For example, the static priority setting may be set to '1', indicating that only sensor events with a priority of '1' (as shown earlier in this disclosure) should be reported in the report, or the static priority setting may be set to '3', indicating that sensor events with a priority of '3', '2' and '1' should be reported in the report 164. The static priority setting may be set based on the requirements of the network entity 160, for example which sorts of information are of interest and which sorts of information are not. The profiling summary 1840 may include a priority value for each recorded sensor event and/or general statistic (as shown earlier in this disclosure), or the report generator 1140 may be configured to know the priority of each type of sensor event (for example, based on the magnitude of CC change) and/or general statistic, and therefore which correspond to particular static priority settings. Using the static priority setting may help the report generator 1140 to condense the size of the report 164 by focussing on sensor events and/or general statistics that will be of most interest to the network entity 160

A report may be generated for each of the channels of interest, and may be generated to be of any particular length depending on the static priority settings. For example, each channel may have a 4-bit report, an 8-bit report, a 16-bit report, etc. It will be appreciated that for shorter reports, less information may be reported on, for example they may identify only whether or not a particular one or two types of sensor event have been detected and/or may include only one or two items of general statistics, without any further detail. In the longer reports, more types of sensor event and/or more general statistics may be reported, without more detail given for each. Thus, it can be seen that the nature of the report is flexible, so it can be adapted to meet the requirements of the network entity 160 and/or the communications channel between the manager 900 and the network entity 160.

Additionally, or alternatively, the report generator 1140 may be configured to receive an on-demand reporting request from the network entity 160 via the communications module 150. In response to this, it may communicate to the network entity 160 the most recent report that it has generated, or it may generate a new report and communicate it to the network entity 160. Where a new report is generated, it may take the same form as the reports identified above and may be based on the static reporting settings, or on on-demand reporting settings included in the on-demand reporting request. In the latter case, the network entity 160 has the opportunity to set a particular on-demand report length and/or a particular on-demand priority setting and/or a particular on-demand time period setting (indicative of the period of time to which the on-demand report should relate), which may provide the network entity 160 with additional flexibility to change the settings for on-demand reporting and to obtain reports whenever it would like.

Additionally, or alternatively, an on-demand reporting request may be issued by a different entity. For example, the user code 1000 of the MCU 130 may be configured to issue on-demand reporting requests to the manager 900.

Additionally, or alternatively, an 'alert' report may be generated by the report generator 1140, wherein it is determined if an alert condition has been met and, if it has, generate an 'alert' report. For example, whilst the above explanation of the profile analyser 1820 indicates that a profiling summary is determined at the end of a profiling period of time (for example, once profiling results 1830 exist for an entire profiling period of time), in an alternative, the profile analyser 1820 may gradually build up the profiling summary 1840 during the profiling period of time, for example with each new profiling result or monitor result that is added to the profiling results 1830. If a profiling result or monitor result is determined to meet an alert condition (for example, it is determined to be indicative of a sensor event, or if the CC simply exceeds the benchmark transfer function value by more than an alert threshold) a report may be generated based on at least that profiling result or monitor result. By generating an 'alert' report in this way, the network entity 160 may receive periodic and/or on demand reports, but also be immediately notified when an alert condition has been met. Alternatively, if the report generator 1140 is configured to generate only 'alert' reports, the network entity 160 may be notified when something important has happened, but otherwise not receive any reports, thereby saving data communications.

In a further alternative, the profile analyser 1820 and report generator 1830 could be configured to operate as described above with respect to periodic profiling summaries and reports, but rather than a report being generated each time a profiling summary is prepared, the report could be generated only when the profiling summary meets an alert condition, for example it indicates that a sensor event has occurred. According to this alternative, the network entity 160 may again be notified when something important has happened, but otherwise not receive any reports, thereby saving data communications.

Secondary Profiler 1150

As identified earlier, the manager 900 may further comprise a secondary profiler 1150. The secondary profiler may be configured to obtain additional information from the monitor module 110 and/or any other entity or module. The additional information may comprise, for example, at least one measurement of an electrical property determined by the measurement sensors 120, such as a measurement of live current $I_A$, neutral current $I_B$ and/or voltage $V_A$, and/or at least one measurement of a further property relating to the electrical measurement system 100, for example a temperature of the electrical measurement system 100. Based on the additional information, the secondary profiler 1150 may determine secondary profile data for each of the channels of interest comprising at least one of:

| Information | Priority (1: high, 3: low) |
|---|---|
| Average RMS | 1 |
| Max and min RMS | 2 |
| Over current/voltage detection | 2 |
| Average active power | 1 |
| Max and min active power | 2 |
| Average relative power | 2 |
| Max and min relative power | 3 |
| Average apparent power | 3 |
| Max and min apparent power | 3 |
| Average line period | 1 |
| Max and min line period | 3 |
| Average power factor | 2 |
| Max and min power factor | 3 |
| Average temperature | 1 |
| Max and min temperature | 3 |

The secondary profile data may be stored in the database associated with the secondary profiler (as identified in FIG. 11), which may be part of the database 1130, or a different database, and the report generator 1140 may be configured to obtain the secondary profile data from the database and include at least some of it in the report 164. Alternatively, the secondary profiler 1150 may be omitted from the manager 900 and the report generator 1140 may be configured to generate the report based at least in part on at least one measurement of at least one electrical property determined by the measurement sensors 120 and/or on at least one measurement of at least one further property relating to the electrical measurement system 100, for example by receiving those one or more measurements directly from the monitor module 110 or any other entity.

Including secondary information in the report 164 may increase the length of the report, or reduce the amount of space available in the report for sensor event reporting. Furthermore, some, most or all of the secondary information identified above is likely to have been communicated to the network entity 160 via some other means or channels, so it may appear that the secondary information is redundant information. However, it has been recognised that for some network entities 160, it is beneficial to receive the same information through two different channels, to ensure that the information is still received even if one of the channels fails and/or so that the information can be cross-checked against each other. Furthermore, it may be helpful to receive sensor event and/or general statics information and also other information in a single report. Thus, it has been recognised that there may be some benefits in including the secondary information in the repot 164.

The skilled person will readily appreciate that various alterations or modifications may be made to the above described aspects of the disclosure without departing from the scope of the disclosure.

Whilst all of the interfaces represented by arrows in FIGS. 1, 9-11, 14 and 18 show direct connections between each of the different entities and modules, it will be appreciated that there may be any number of intermediate entities or modules as part of those interfaces, for example communications routers, etc. Furthermore, whilst each of these figures shows representations of different modules and sub-modules, it will be appreciated that this representation is for the sake of clarity only and the functionality of these modules and sub-modules may be combined or separated in any suitable way. For example, the functionality of the controller 1110 and/or profiler 1120 and/or secondary profiler 1150 and/or report generator 1140 may be implemented by a single module, for example a single software or hardware module, or each may be subdivided into two or more software and/or hardware modules or sub-modules. Furthermore, whilst the manager 900 is disclosed as being implemented within the MCU 130, it may alternatively be implemented elsewhere, for example as part of the monitor module 110.

The aspects of the present disclosure described in all of the above may be implemented by software, hardware or a combination of software and hardware. The functionality of the manager 900 may be implemented by software, for example firmware, comprising computer readable code, which when executed on the processor of any electronic device, performs the functionality described above. The software may be stored on any suitable computer readable medium, for example a non-transitory computer-readable medium, such as read-only memory, random access memory, CD-ROMs, DVDs, Blue-rays, magnetic tape, hard disk drives, solid state drives and optical drives.

The invention claimed is:

1. An apparatus for controlling an operation of an electrical measurement system, the apparatus being configured to:
   include a plurality of operating states comprising at least:
   a) a first operating state to monitor at least a first measurement sensor for measuring a first electrical property of a utility meter to determine a first monitor result comprising:
      1) an estimate of a transfer function of the first measurement sensor, and
      2) a corresponding certainty value of the estimate of the transfer function of the first measurement sensor,
   b) a second operating state which does not monitor the first measurement sensor of the electrical measurement system; and, wherein the apparatus is also configured for:
   using the first operating state to determine the first monitor result of the utility meter;
   selecting one of the plurality of operating states, wherein the selecting is based at least in part on at least one of the first monitor result or the corresponding certainty value; and performing a control action for controlling the operation to implement the selected operating state.

2. The apparatus of claim 1, wherein in response to selecting the first operating state, the control action comprises communicating a first control instruction to monitor the first measurement sensor for a first individual run length of time to determine the first monitor result.

3. The apparatus of claim 2, wherein the first individual run length of time is a specified length of time that is a portion of the first monitoring time window.

4. The apparatus of claim 3, further configured to determine the first individual run length of time in order to achieve a desired level of accuracy for the estimate of the transfer function of the first measurement sensor by comparing one or more previously determined certainty values against a target certainty value.

5. The apparatus of claim 2, wherein the first individual run length of time is a variable length of time and the apparatus is further configured to determine the first individual run length of time.

6. The apparatus of claim 5, further configured to:
determine the first individual run length of time based at least in part on one or more previously determined certainty values corresponding to a respective one or more previously determined estimates of the transfer function of the first sensor.

7. The apparatus of claim 1, further configured to select one of the plurality of operating states based at least in part on one or more previously determined certainty values.

8. The apparatus of claim 7, configured to select one of the plurality of operating states by:
determining a first utilization target based on the one or more previously determined certainty values, wherein the first utilization target is indicative of a target total portion of the first monitoring time window to be spent determining monitor results relating to the first measurement sensor; and
selecting one of the plurality of operating states based at least in part on the first utilization target.

9. The apparatus of claim 8, wherein determining the first utilization target comprises:
comparing the one or more previously determined certainty values against a target minimum level of accuracy to be achieved for the estimate of the transfer function of the first measurement sensor, and
in response to the one or more previously determined certainty values failing to achieve the target minimum level of accuracy, setting the first utilization target to be greater than a previous first utilization target that was in place during determination of one or more previously determined estimates of the transfer function of the first sensor.

10. The apparatus of claim 8, wherein determining the first utilization target comprises:
comparing the one or more previously determined certainty values against a target maximum level of accuracy, and
in response to the one or more previously determined certainty values are indicative of the target maximum level of accuracy, setting the first utilization target to be less than a previous first utilization target that was in place during determination of one or more previously determined estimates of the transfer function of the first measurement sensor.

11. The apparatus of claim 8, wherein selecting one of the plurality of operating states comprises comparing the first utilization target against an updated first utilization, wherein the updated first utilization is indicative of a portion of the first monitoring time window that has already been spent determining monitor results relating to the first measurement sensor.

12. The apparatus of claim 1, further configured to select one of the plurality of operating states such that time spent to determine the monitor results relating to the first measurement sensor during a monitoring time window is sufficient for estimates of the transfer function of the first measurement sensor determined during the monitoring time window to achieve a desired level of accuracy for a given measurement of a first electrical property.

13. The apparatus of claim 1, wherein the plurality of operating states further comprises:
c) a third operating state to monitor at least a second measurement sensor of the electrical measurement system to determine a second monitor result comprising an estimate of the transfer function of the second measurement sensor and a corresponding certainty value of the estimate of the transfer function of the second measurement sensor, and wherein
the second measurement sensor is for measuring a second electrical property.

14. The apparatus of claim 13 wherein in response to selecting the third operating state, the control action comprises communicating a second control instruction to monitor the second measurement sensor for a second individual run specified length of time to determine the second monitor result.

15. The apparatus of claim 14, wherein the second individual run length of time is a fixed length of time.

16. The apparatus of claim 14, wherein the second individual run length of time is a variable length of time, and the apparatus is further configured to determine the second individual run length of time.

17. The apparatus of claim 16, further configured to:
determine the second individual run length of time based at least in part on the one or more previously determined certainty values corresponding to a respective one or more previously determined estimates of the transfer function of the second measurement sensor.

18. The apparatus of claim 13, further configured to select one of the plurality of dule operating states based at least in part on one or more previously determined certainty values corresponding to a respective one or more previously determined estimates of the transfer function of the second measurement sensor.

19. The apparatus of claim 13, further configured to select one of the plurality of operating states based at least in part on at least one of a first target level of accuracy for one or more estimates relating to the first measurement sensor or a second target level of accuracy for estimates relating to the second measurement sensor.

20. The apparatus of claim 13, further configured to select one of the plurality of operating states by:
determining a first utilization target based on one or more previously determined certainty values corresponding to the respective one or more previously determined estimates of the transfer function of the first sensor, wherein the first utilization target is indicative of a target total portion of the monitoring time window to be spent determining the monitor results relating to the first measurement sensor of the electrical measurement system;
determining a second utilization target based on the one or more previously determined certainty values corresponding to the respective one or more previously determined estimates of the transfer function of the second sensor, wherein the second utilization target is indicative of a target total portion of the monitoring time window to be spent determining the monitor results relating to the second measurement sensor of the electrical measurement system; and selecting one of the plurality of operating states based at least in part on the first utilization target and the second utilization target.

21. The apparatus of claim 20, wherein selecting one of the plurality of operating states comprises comparing the first utilization target against an updated first utilization target and comparing the second utilization target against an updated second utilization target, wherein the updated first utilization target is indicative of a proportion portion of the first monitoring time window that has already been spent to determine the monitor results relating to the first measurement sensor, and wherein the updated second utilization target is indicative of a proportion portion of the second monitoring time window having a specified total run time that has already been spent to determinr the monitor results relating to the second measurement sensor.

22. The apparatus of claim 13, wherein in response to selecting the third operating state, the apparatus determines a schedule of priority for operating states based on at least one of target level of accuracy of the first measurement sensor, the second measurement sensor, or the first utilization target and second utilization target.

23. The apparatus of claim 13, wherein the the previously determined certainty value includes an aggregation of all previous corresponding certainty values for at least one of the first or second monitor result, and based on the aggregation the priority for which measurement sensor to monitor and the operating state is selected.

24. The apparatus of claim 1, wherein the previously determined certainty value includes an aggregation of two or more previous corresponding certainty values of the first monitor result, and the operating state is selected based on the aggregation.

25. An electrical measurement system for measuring at least one electrical property, the electrical measurement system comprising:

a first measurement sensor for measuring a first electrical property;

a first module configured to operate in one of a plurality of operating states comprising:

a) a first operating state to monitor at least the first measurement sensor to determine a first monitor result comprising:

1) an estimate of a transfer function of the first measurement sensor, and 2) a corresponding certainty value indicative of the accuracy of the estimate of the transfer function of the first measurement sensor, b) a second operating state in which no measurement sensor of the electrical measurement system is monitored, and a a second module configured to:

using the first operating state, measure the first electrical property of a utility meter to determine the first monitor result;

select one of the plurality of operating states wherein the selection is from a group consisting of the first monitor result an utilization target based on the one or more previously determined certainty values, wherein the first utilization target is indicative of a target total proportion portion of the first monitoring time window to be spent by the monitor module determining monitor results relating to the first measurement sensor; and perform a control action for controlling the operation to implement the selected operating state.

26. A method of controlling an electrical measurement system, the method comprising:

including a plurality of operating states comprising:

a) a first operating state to monitor at least a first measurement sensor for measuring a first electrical property of the electrical measurement system to determine a first monitor result comprising:

1) an estimate of a transfer function of the first measurement sensor, and 2) a corresponding certainty value indicative of the accuracy of the estimate of the transfer function of the first measurement sensor, b) a second operating state in which no measurement sensor of the electrical measurement system is monitored;

using the first operating state, measure the first electrical property of a utility meter to determine the first monitor result;

selecting one of the plurality of operating states, wherein the selection is based at least in part on at least one of the first monitor result or the corresponding certainty value or a utilization target based on the one or more previously determined certainty values, wherein the first utilization target is indicative of a target total proportion portion of the first monitoring time window to be spent by the monitor module determining. monitor results relating to the first measurement sensor; and performing a control action for controlling the operation to implement the selected operating state.

27. A non-transitory computer readable medium storing computer readable instructions that, in response to being executed by at least one processor, cause the at least one processor to perform the method of claim 26.

* * * * *

UNITED STATES PATENT AND TRADEMARK OFFICE
CERTIFICATE OF CORRECTION

PATENT NO. : 10,768,262 B2
APPLICATION NO. : 15/691414
DATED : September 8, 2020
INVENTOR(S) : Danesh et al.

Page 1 of 1

It is certified that error appears in the above-identified patent and that said Letters Patent is hereby corrected as shown below:

On the Title Page

In item (73), in "Assignee", in Column 1, Line 2, delete "Campany," and insert --Company,-- therefor In the Claims In Column 48, Line 27, in Claim 14, before "second", insert --specified--

In Column 48, Line 43, in Claim 18, before "operating", delete "dule"

In Column 48, Line 52, in Claim 19, before "estimates", insert --one or more--

In Column 49, Line 15, in Claim 21, after "target,", insert --¶--

In Column 49, Line 16, in Claim 21, before "the updated", insert --wherein--

In Column 49, Line 23, in Claim 21, delete "determinr" and insert --determine-- therefor In Column 49, Line 31, in Claim 23, delete "the the" and insert --the-- therefor In Column 50, Line 7, in Claim 25, delete "a a" and insert --a-- therefor In Column 50, Line 13, in Claim 25, after "result", insert --and--

In Column 50, Line 45, in Claim 26, delete "determining." and insert --determining-- therefor Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*